(12) United States Patent
Toda

(10) Patent No.: US 8,448,051 B2
(45) Date of Patent: May 21, 2013

(54) MEMORY SYSTEM AND METHOD OF DATA WRITING AND READING IN MEMORY SYSTEMS

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 343 days.

(21) Appl. No.: 13/011,318

(22) Filed: Jan. 21, 2011

(65) Prior Publication Data

US 2011/0239091 A1 Sep. 29, 2011

(30) Foreign Application Priority Data

Mar. 23, 2010 (JP) ................................. 2010-066440

(51) Int. Cl.
*H03M 13/03* (2006.01)

(52) U.S. Cl.
USPC .......................................................... 714/787

(58) Field of Classification Search
USPC .................... 714/746, 761, 782, 784–787
See application file for complete search history.

(56) References Cited

U.S. PATENT DOCUMENTS

| | | | |
|---|---|---|---|
| 8,225,180 B2 * | 7/2012 | Jiang et al. ...................... | 714/773 |
| 8,359,516 B2 * | 1/2013 | Weingarten ................... | 714/752 |
| 2009/0049366 A1 | 2/2009 | Toda | |
| 2009/0198881 A1 | 8/2009 | Toda | |
| 2010/0107039 A1 | 4/2010 | Toda | |
| 2010/0115383 A1 | 5/2010 | Toda | |
| 2010/0235714 A1 | 9/2010 | Toda | |

FOREIGN PATENT DOCUMENTS

| | | |
|---|---|---|
| JP | 2009-181439 | 8/2009 |
| WO | WO 2008/099723 A1 | 8/2008 |

OTHER PUBLICATIONS

Yu et al., A new class of codes in Lee Mietric and their application to error corrections modulation codes, Sep. 1996, IEEE trans. on. magnetics, vol. 32, No. 5, p. 3935-3937.*
Wen et al., Improved decoding of algebraic geometric codes with respect to the Lee Metric, 2005, IEEE, p. 119-124.*
Ron M. Roth et al., "Lee-Metric BCH Codes and their Application to Constrained and Partial-Response Channels", IEEE Transactions on Information Theory, vol. 40, No. 4, Jul. 1994, pp. 1083-1096.
U.S. Appl. No. 13/232,456, filed Sep. 14, 2011, Toda.
U.S. Appl. No. 13/232,312, filed Sep. 14, 2011, Toda.
U.S. Appl. No. 13/237,418, filed Sep. 20, 2011, Toda.

* cited by examiner

*Primary Examiner* — Shelly A Chase
(74) *Attorney, Agent, or Firm* — Oblon, Spivak, McClelland, Maier & Neustadt, L.L.P.

(57) ABSTRACT

A memory system according to the embodiment comprises a p-adic number converter unit operative to convert δ-digit, h-bit symbols to a k-digit, p-adic data word (p is a prime of 3 or more); an encoder unit operative to generate, from the p-adic data word, a code C composed of a residual field Zp of the prime p; a memory unit operative to store the code C as write data; an error correcting unit operative to apply an operation using a syndrome S generated from read data Y for error correcting the read data Y to regenerate the code C; a decoder unit operative to reverse-convert the code C to regenerate the p-adic data word; and a binary converter unit operative to convert the data word to a binary number to regenerate the binary data D.

18 Claims, 33 Drawing Sheets

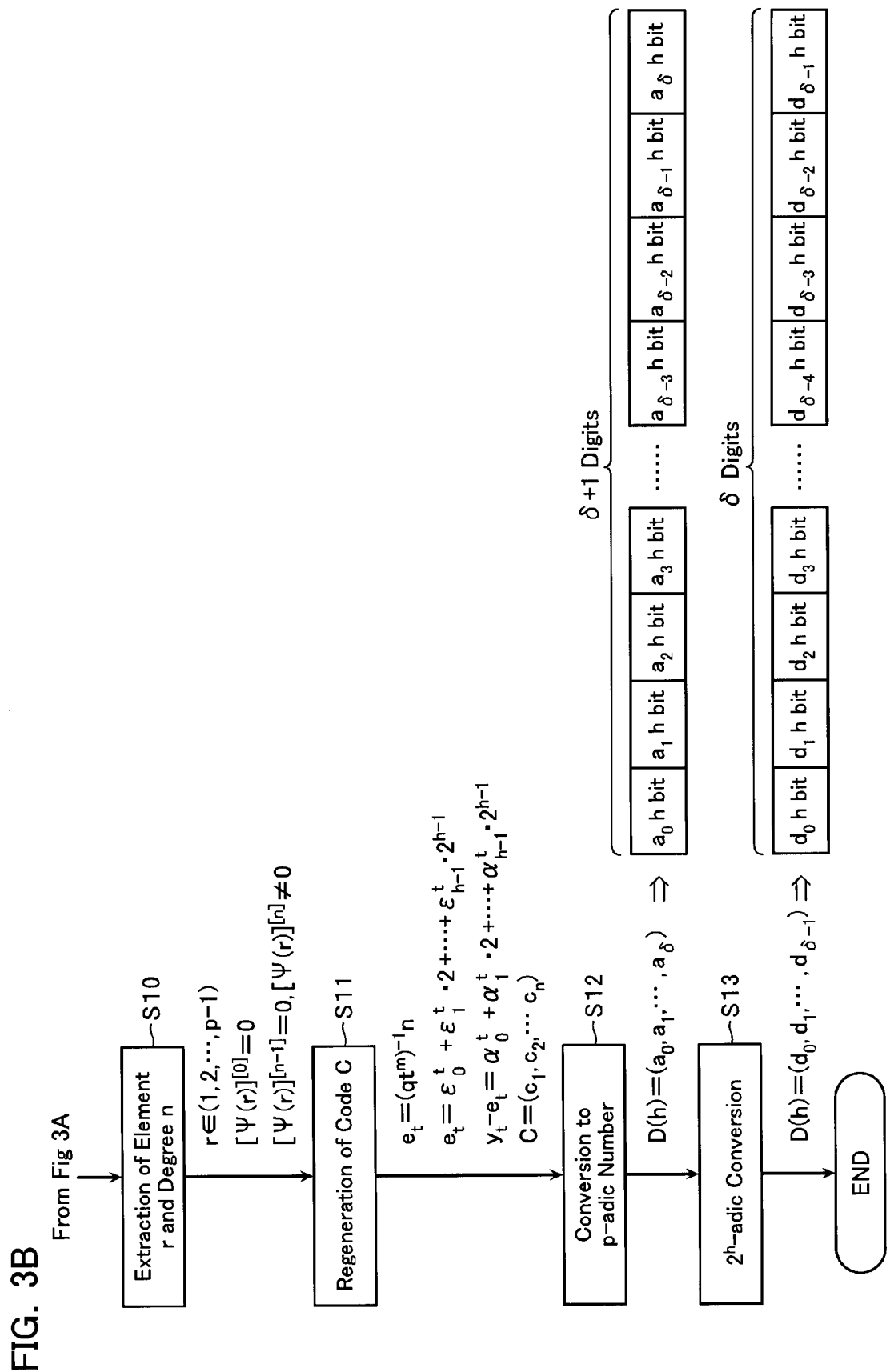

Physical Quantity Level (Threshold)

MC1

Physical Quantity Level (Threshold)

MC2 or

Physical Quantity Level (Threshold)

MC1

Physical Quantity Level (Threshold)

| Number of Levels ($2^{h-2}$) | | 2<br>h=3 | 4<br>h=4 | 8<br>h=5 | 16<br>h=6 | 32<br>h=7 |
|---|---|---|---|---|---|---|
| $2^{h-2} < p < 2^h$<br>Minimum Remedy<br>Rate = 2/(p-1) | | 7<br>1/3 | 13<br>1/6 | 31<br>1/15 | 61<br>1/30 | 127<br>1/63 |
| Mmax | ε=2 | 6 | 32 | 130 | 336 | 854 |
| | =3 | 3 | 28 | 125 | 330 | 847 |
| | =4 | – | 24 | 120 | 324 | 840 |
| | =5 | – | 20 | 115 | 318 | 833 |
| | =6 | – | 16 | 110 | 312 | 826 |
| | =7 | – | 12 | 105 | 306 | 819 |
| M | ε=2 | 4 | 32 | 128 | 336 | 852 |
| | =3 | 2 | 28 | 124 | 328 | 844 |
| | =4 | – | 24 | 120 | 324 | 840 |
| | =5 | – | 20 | 112 | 316 | 832 |
| | =6 | – | 16 | 108 | 312 | 824 |
| | =7 | – | 12 | 104 | 304 | 816 |
| δ | ε=2 | 2 | 8 | 26 | 56 | 122 |
| | =3 | 1 | 7 | 25 | 55 | 121 |
| | =4 | – | 6 | 24 | 54 | 120 |
| | =5 | – | 5 | 23 | 53 | 119 |
| | =6 | – | 4 | 22 | 52 | 118 |
| | =7 | – | 3 | 21 | 51 | 117 |
| Conventional<br>Number of Cells | ε=2 | 4 | 16 | 43 | 84 | 171 |
| | =3 | 1 | 14 | 42 | 82 | 169 |
| | =4 | – | 12 | 40 | 81 | 168 |
| | =5 | – | 10 | 38 | 79 | 167 |
| | =6 | – | 8 | 36 | 78 | 165 |
| | =7 | – | 6 | 35 | 76 | 164 |
| Redundancy<br>2(p-1)/<br>Number of Cells | ε=2 | 3 | 1.5 | 1.40 | 1.43 | 1.47 |
| | =3 | 12 | 1.71 | 1.43 | 1.46 | 1.49 |
| | =4 | – | 2 | 1.5 | 1.48 | 1.5 |
| | =5 | – | 2.4 | 1.58 | 1.52 | 1.51 |
| | =6 | – | 3 | 1.67 | 1.54 | 1.53 |
| | =7 | – | 4 | 1.71 | 1.58 | 1.54 |

FIG. 17

| Unit of Processing | | 32B | 64B | 128B | 256B | 512B |
|---|---|---|---|---|---|---|
| M | | 256 | 512 | 1024 | 2048 | 4096 |
| $GF(2^n)$ | | $2^6=64$ | $2^7=128$ | $2^8=256$ | – | $2^9=512$ |
| RS-ECC(2 Symbols) | | 4x6=24 | 4x7=28 | 4x8=32 | – | 4x9=36 |
| $\delta$ | h=6 | 43 | 86 | 171 | 342 | 683 |
|  | h=7 | 37 | 74 | 147 | 293 | 586 |
|  | h=8 | 32 | 64 | 128 | 256 | 512 |
|  | h=9 | 29 | 57 | 114 | 228 | 456 |
| $\delta + \varepsilon + 3$ ($\varepsilon=2$) | h=6 | 48 | 91 | 176 | 349 | 688 |
|  | h=7 | 42 | 79 | 152 | 299 | 591 |
|  | h=8 | 37 | 69 | 133 | 262 | 517 |
|  | h=9 | 34 | 62 | 119 | 234 | 461 |
| $2^{h-1}<p<2^h$ (Minimum Remedy Rate) | h=6 | 53(1/26) | – | – | – | – |
|  | h=7 | – | 79(1/39) | – | – | – |
|  | h=8 | – | – | 137(1/68) | – | – |
|  | h=9 | – | – | – | – | 461(1/230) |
| $\kappa$ | h=6 | 5 | – | – | – | – |
|  | h=7 | – | 0 | – | – | – |
|  | h=8 | – | – | 4 | – | – |
|  | h=9 | – | – | – | – | 0 |
| Redundant Bit $h(p-1-\delta)$ (Redundancy) | h=6 | 54(1.21) | – | – | – | – |
|  | h=7 | – | 28(1.05) | – | – | – |
|  | h=8 | – | – | 64(1.06) | – | – |
|  | h=9 | – | – | – | – | 36(1.01) |

FIG. 18

| Unit of Processing | | 32B | 64B | 128B | 256B | 512B |
|---|---|---|---|---|---|---|
| M | | 256 | 512 | 1024 | 2048 | 4096 |
| $GF(2^n)$ | | $2^6=64$ | $2^7=128$ | $2^8=256$ | – | $2^9=512$ |
| RS-ECC(3 Symbols) | | 6x6=36 | 6x7=42 | 6x8=48 | – | 6x9=54 |
| $\delta$ | h=6 | 43 | 86 | 171 | 342 | 683 |
| | h=7 | 37 | 74 | 147 | 293 | 586 |
| | h=8 | 32 | 64 | 128 | 256 | 512 |
| | h=9 | 29 | 57 | 114 | 228 | 456 |
| $\delta + \varepsilon + 3$ ($\varepsilon=3$) | h=6 | 49 | 92 | 177 | 349 | 689 |
| | h=7 | 43 | 80 | 153 | 299 | 592 |
| | h=8 | 38 | 70 | 134 | 262 | 518 |
| | h=9 | 35 | 63 | 120 | 234 | 462 |
| $2^{h-1}<p<2^h$ (Minimum Remedy Rate) | h=6 | 53(1/26) | – | – | – | – |
| | h=7 | – | 83(1/41) | – | – | – |
| | h=8 | – | – | 137(1/68) | – | – |
| | h=9 | – | – | – | – | 463(1/231) |
| $\kappa$ | h=6 | 4 | – | – | – | – |
| | h=7 | – | 3 | – | – | – |
| | h=8 | – | – | 3 | – | – |
| | h=9 | – | – | – | – | 1 |
| Redundant Bit $h(p-1-\delta)$ (Redundancy) | h=6 | 54(1.21) | – | – | – | – |
| | h=7 | – | 56(1.11) | – | – | – |
| | h=8 | – | – | 64(1.06) | – | – |
| | h=9 | – | – | – | – | 54(1.01) |

FIG. 19

| Unit of Processing | | 32B | 64B | 128B | 256B | 512B |
|---|---|---|---|---|---|---|
| M | | 256 | 512 | 1024 | 2048 | 4096 |
| $GF(2^n)$ | | $2^6=64$ | $2^7=128$ | $2^8=256$ | – | $2^9=512$ |
| RS-ECC(4 Symbols) | | 8x6=48 | 8x7=56 | 8x8=64 | – | 8x9=72 |
| $\delta$ | h=6 | 43 | 86 | 171 | 342 | 683 |
| | h=7 | 37 | 74 | 147 | 293 | 586 |
| | h=8 | 32 | 64 | 128 | 256 | 512 |
| | h=9 | 29 | 57 | 114 | 228 | 456 |
| $\delta + \varepsilon + 3$ ($\varepsilon=4$) | h=6 | 50 | 94 | 178 | 349 | 690 |
| | h=7 | 44 | 81 | 154 | 300 | 593 |
| | h=8 | 39 | 71 | 135 | 263 | 519 |
| | h=9 | 36 | 64 | 121 | 235 | 463 |
| $2^{h-1}<p<2^h$ (Minimum Remedy Rate) | h=6 | 53(1/26) | – | – | – | – |
| | h=7 | – | 83(1/41) | – | – | – |
| | h=8 | – | – | 137(1/68) | – | – |
| | h=9 | – | – | – | – | 467(1/233) |
| $\kappa$ | h=6 | 3 | – | – | – | – |
| | h=7 | – | 2 | – | – | – |
| | h=8 | – | – | – | 2 | – |
| | h=9 | – | – | – | – | 4 |
| Redundant Bit $h(p-1-\delta)$ (Redundancy) | h=6 | 54(1.21) | – | – | – | – |
| | h=7 | – | 56(1.11) | – | – | – |
| | h=8 | – | – | 64(1.06) | – | – |
| | h=9 | – | – | – | – | 90(1.02) |

FIG. 20

| Unit of Processing | | 32B | 64B | 128B | 256B | 512B |
|---|---|---|---|---|---|---|
| M | | 256 | 512 | 1024 | 2048 | 4096 |
| $GF(2^n)$ | | $2^6=64$ | $2^7=128$ | $2^8=256$ | – | $2^9=512$ |
| RS-ECC(6 Symbols) | | 12x6=72 | 12x7=84 | 12x8=96 | – | 12x9=108 |
| $\delta$ | h=6 | 43 | 86 | 171 | 342 | 683 |
| | h=7 | 37 | 74 | 147 | 293 | 586 |
| | h=8 | 32 | 64 | 128 | 256 | 512 |
| | h=9 | 29 | 57 | 114 | 228 | 456 |
| $\delta + \varepsilon + 3$ ($\varepsilon =6$) | h=6 | 52 | 95 | 180 | 352 | 692 |
| | h=7 | 46 | 83 | 156 | 303 | 595 |
| | h=8 | 41 | 73 | 137 | 266 | 521 |
| | h=9 | 38 | 66 | 123 | 238 | 465 |
| $2^{h-1}<p<2^h$ (Minimum Remedy Rate) | h=6 | 53(1/26) | – | – | – | – |
| | h=7 | – | 83(1/41) | – | – | – |
| | h=8 | – | – | 137(1/68) | – | – |
| | h=9 | – | – | – | – | 467(1/233) |
| $\kappa$ | h=6 | 1 | – | – | – | – |
| | h=7 | – | 0 | – | – | – |
| | h=8 | – | – | 0 | – | – |
| | h=9 | – | – | – | – | 2 |
| Redundant Bit $h(p-1-\delta)$ (Redundancy) | h=6 | 54(1.21) | – | – | – | – |
| | h=7 | – | 56(1.11) | – | – | – |
| | h=8 | – | – | 64(1.06) | – | – |
| | h=9 | – | – | – | – | 90(1.02) |

FIG. 21

| Unit of Processing | | 32B | 64B | 128B | 256B | 512B |
|---|---|---|---|---|---|---|
| M | | 256 | 512 | 1024 | 2048 | 4096 |
| $GF(2^n)$ | | $2^6=64$ | $2^7=128$ | $2^8=256$ | – | $2^9=512$ |
| RS-ECC(7 Symbols) | | 14x6=84 | 14x7=98 | 14x8=112 | – | 14x9=126 |
| $\delta$ | h=6 | 43 | 86 | 171 | 342 | 683 |
| | h=7 | 37 | 74 | 147 | 293 | 586 |
| | h=8 | 32 | 64 | 128 | 256 | 512 |
| | h=9 | 29 | 57 | 114 | 228 | 456 |
| $\delta + \varepsilon + 3$ ($\varepsilon=7$) | h=6 | 54 | 96 | 181 | 352 | 693 |
| | h=7 | 48 | 84 | 157 | 303 | 596 |
| | h=8 | 43 | 74 | 138 | 266 | 522 |
| | h=9 | 39 | 67 | 124 | 238 | 466 |
| $2^{h-1} < p < 2^h$ (Minimum Remedy Rate) | h=6 | 59(1/29) | – | – | – | – |
| | h=7 | – | 89(1/44) | – | – | – |
| | h=8 | – | – | 139(1/68) | – | – |
| | h=9 | – | – | – | – | 467(1/233) |
| $\kappa$ | h=6 | 0 | – | – | – | – |
| | h=7 | – | 5 | – | – | – |
| | h=8 | – | – | 1 | – | – |
| | h=9 | – | – | – | – | 1 |
| Redundant Bit $h(p-1-\delta)$ (Redundancy) | h=6 | 54(1.21) | – | – | – | – |
| | h=7 | – | 98(1.19) | – | – | – |
| | h=8 | – | – | 80(1.08) | – | – |
| | h=9 | – | – | – | – | 90(1.02) |

FIG. 22

| Unit of Processing | | 32B | 64B | 128B | 256B | 512B |
|---|---|---|---|---|---|---|
| M | | 256 | 512 | 1024 | 2048 | 4096 |
| $GF(2^n)$ | | $2^6=64$ | $2^7=128$ | $2^8=256$ | – | $2^9=512$ |
| RS-ECC(8 Symbols) | | 16x6=96 | 16x7=112 | 16x8=128 | – | 16x9=144 |
| $\delta$ | h=6 | 43 | 86 | 171 | 342 | 683 |
| | h=7 | 37 | 74 | 147 | 293 | 586 |
| | h=8 | 32 | 64 | 128 | 256 | 512 |
| | h=9 | 29 | 57 | 114 | 228 | 456 |
| $\delta + \varepsilon + 3$ ($\varepsilon=8$) | h=6 | 54 | 97 | 182 | 353 | 694 |
| | h=7 | 48 | 85 | 158 | 304 | 597 |
| | h=8 | 43 | 75 | 139 | 267 | 523 |
| | h=9 | 40 | 68 | 125 | 239 | 467 |
| $2^{h-1} < p < 2^h$ (Minimum Remedy Rate) | h=6 | 59(1/29) | – | – | – | – |
| | h=7 | – | 89(1/44) | – | – | – |
| | h=8 | – | – | 139(1/68) | – | – |
| | h=9 | – | – | – | – | 467(1/233) |
| $\kappa$ | h=6 | 5 | – | – | – | – |
| | h=7 | – | 4 | – | – | – |
| | h=8 | – | – | 0 | – | – |
| | h=9 | – | – | – | – | 0 |
| Redundant Bit $h(p-1-\delta)$ (Redundancy) | h=6 | 90(1.35) | – | – | – | – |
| | h=7 | – | 98(1.19) | – | – | – |
| | h=8 | – | – | 80(1.08) | – | – |
| | h=9 | – | – | – | – | 90(1.02) |

FIG. 23

| Errors | RS-ECC (2 Symbols) | $2^n$-BCH-ECC (4 Bits) | P-LM-ECC (4 Symbols at Maximum) |
|---|---|---|---|
| 2 Symbols | OK | NG | OK |
| 3 Symbols | NG | OK | OK |
| 4 Symbols | NG | OK | OK |

MEMORY SYSTEM AND METHOD OF DATA WRITING AND READING IN MEMORY SYSTEMS

CROSS-REFERENCE TO RELATED APPLICATION

This application is based upon and claims the benefit of priority from the prior Japanese Patent Application No. 2010-66440, filed on Mar. 23, 2010, the entire contents of which are incorporated herein by reference.

FIELD

The embodiment relates to a memory system and a method of data writing and reading in memory systems.

BACKGROUND

As memory systems have higher capacities, fine fabrications of memory cells, increases in the number of storage bits per cell, and achievements of memory cell arrays with three-dimensional structures have been developed. In a memory system, however, the larger the capacity, the easier the errors occur in stored data. Thus, many memory systems with an on-chip ECC (Error Correcting Code) system have been proposed (for example, Patent Document 1: JP 2009-181439A). The ECC system treats random bit errors (hereinafter simply referred to as "random errors"). In this case, it can support such random bit errors that arise in data writing and so forth. In high-density, three-dimensionally structured memory cells, in addition to such random bit errors, bit errors may arise intensively in a certain region (hereinafter referred to as "burst errors") due to defects caused on production. The above-described ECC system cannot support such burst errors. Several other on-chip ECC systems have been proposed (Patent Document 2: WO 2008-099723, for example). It is difficult, though, to say that these on-chip ECC systems can support both random errors and burst errors sufficiently.

BRIEF DESCRIPTION OF THE DRAWINGS

FIG. 3B is a diagram showing a flow of data reading in the present memory system.

FIG. 16 is a diagram showing a relation between the number of levels, the redundancy and so forth of memory cells in the present memory system.

FIG. 17 is a diagram showing a relation among the unit of processing, the redundancy and so forth in a memory system capable of correcting 2-symbol errors according to a second embodiment.

FIG. 18 is a diagram showing a relation among the unit of processing, the redundancy and so forth in the present memory system capable of correcting 3-symbol errors.

FIG. 19 is a diagram showing a relation among the unit of processing, the redundancy and so forth in a memory system capable of correcting 4-symbol errors according to a second embodiment.

FIG. 20 is a diagram showing a relation among the unit of processing, the redundancy and so forth in the present memory system capable of correcting 6-symbol errors.

FIG. 21 is a diagram showing a relation among the unit of processing, the redundancy and so forth in the present memory system capable of correcting 7-symbol errors.

FIG. 22 is a diagram showing a relation among the unit of processing, the redundancy and so forth in the present memory system capable of correcting 8-symbol errors.

FIG. 23 is a diagram for comparing the error correcting ability of the ECC system on the memory system according to the embodiment with those of other ECC systems.

DETAILED DESCRIPTION

Figure 1:
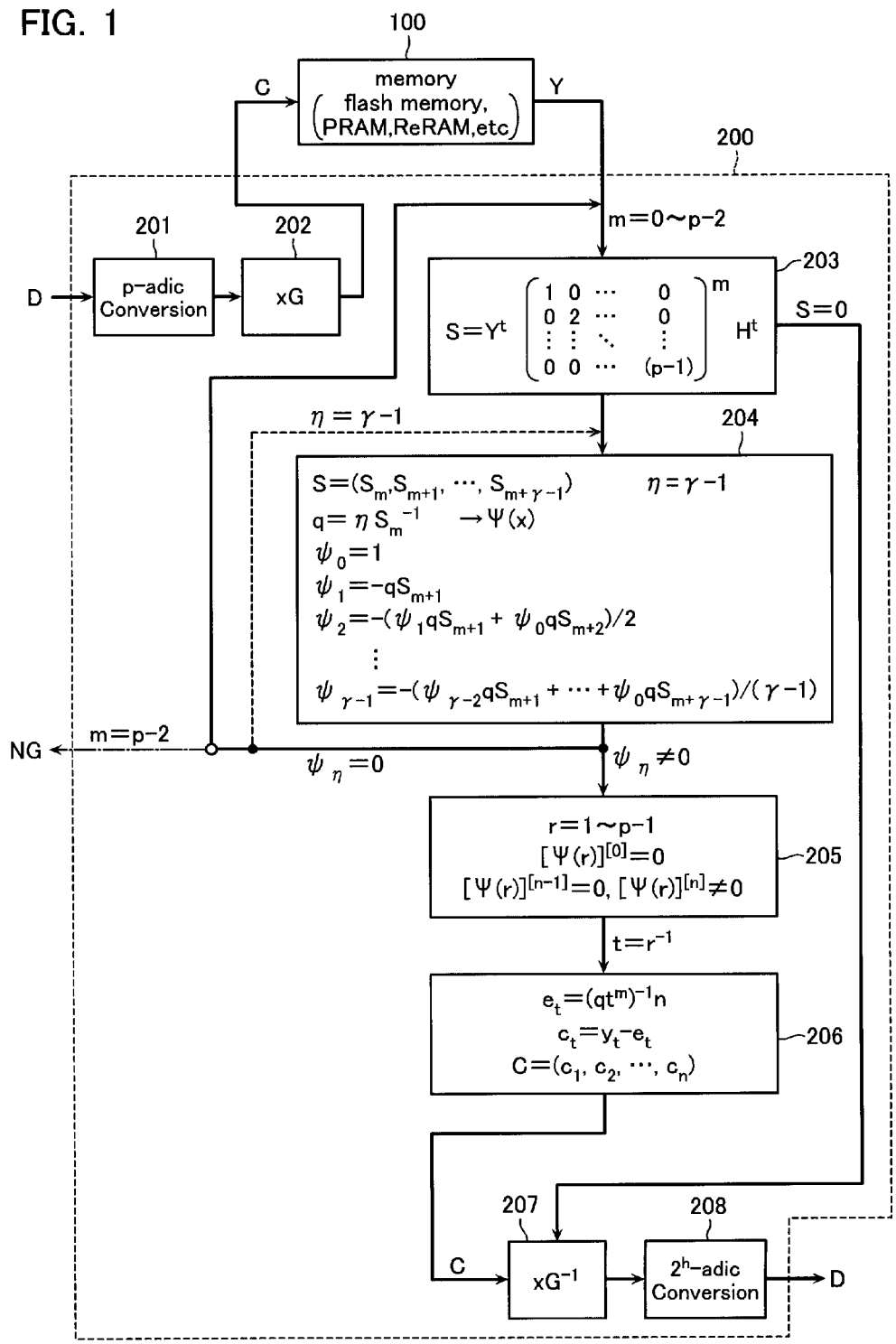
FIG. 1 is a block diagram of a memory system according to a first embodiment.

A memory system according to the embodiment comprises a p-adic number converter unit operative to divide batch-processed binary data D into δ-digit (δ is an integer), h-bit (h is an integer) symbols and convert the symbols to a k-digit (k is an integer), p-adic data word (p is a prime of 3 or more); an encoder unit operative to generate, from the data word p-adic converted at the p-adic number converter unit, a code C composed of a residual field Zp of the prime p, of n-digit (n=p−1) code words having numbers on digits each indicated by h bits; a memory unit operative to store the code C of Zp generated at the encoder unit as write data; an error correcting unit operative to generate, from read data Y read out from the memory unit, a syndrome S and apply an operation using the generated syndrome S for error correcting the read data Y to regenerate the code C of Zp; a decoder unit operative to reverse-convert the code C of Zp regenerated at the error correcting unit to regenerate the p-adic data word; and a binary converter unit operative to convert the data word regenerated at the decoder unit to a binary number to regenerate the binary data D.

The following description is given to memory systems and methods of data writing and reading in memory systems according to the embodiments with reference to the drawings.

[First Embodiment]

A first embodiment is described below.

Higher capacities of memory systems may require fine fabrications of memory cells, memory cell arrays with three-dimensional structures, and memory cells of the multi-value storage type. In this case, defects caused in the memory systems are various.

For example, if there are defects in the structures of memory cells and so forth, the defects hardly arise in a certain memory cell restrictively. Instead, the defects arise intensively in plural memory cells within a certain range. On the other hand, if the operations of memory cells become unstable, the defects distribute over a wide range. Therefore, such the memory system requires an ECC system capable of checking and correcting both burst errors and random errors.

With this regard, the conventional ECC system (hereinafter referred to as "RS-ECC system") in accordance with the Reed-Solomon code (hereinafter referred to as "RS code") is difficult to check and correct a variety of random errors even if it can check and correct burst errors.

In addition to the RS-ECC system, there is another ECC system in accordance with a BCH code using $GF(2^n)$ that is a Galois field on the basis of a power of 2 (hereinafter referred to as "$2^n$-BCH-ECC system"). The BCH-ECC system can check and correct both burst errors and random errors. An ECC process requires an addition of a redundant bit on data coding and thus it needs an extra process of at least 1 bit more than actual data. Namely, treatment of $2^n$-bit data uses GF $(2^{n+1})$. This means that it requires an operation of data by double the amount of actual data. Particularly, in a mass-storage memory system with increasingly larger batch-handled data, the computational complexity becomes enormous and accordingly enlarges the circuit scale and extends the processing time.

The present embodiment proposes an ECC system in accordance with a Lee Metric Code using GF(p) that is a Galois field on the basis of a prime p, that is, an irreducible residue class Zp (hereinafter referred to as "p-LM-ECC system") as an alternative ECC system to the $2^n$-BCH-ECC system. The p-LM-ECC system is operative to symbolize data and correct errors in symbols and, in that sense, applies a scheme close to the RS-ECC system. The following description is given to a p-LM-ECC system capable of correcting 2 random symbol errors as a specific example.

While taking up the problems again in the case of the use of $GF(2^n)$, the directionality of construction of the p-LM-ECC system according to the present embodiment is described. The problems described herein include one on a $2^n$-BCH-ECC system for general processing and one on an ECC system in accordance with the RS code using $GF(2^n)$ to realize fast processing for on-chip (hereinafter referred to as "$2^n$-RS-ECC system").

These 2 ECC systems are common in the process of generating a syndrome for an error but different in the way of processing the syndrome.

The processing of the syndrome is divided into 2 steps: the first step of constructing a solution searching polynomial $\Lambda(x)$; and the second step of searching a root of $\Lambda(x)=0$.

The $2^n$-BCH-ECC system seeks a solution searching polynomial $\Lambda(x)$ that can satisfy a series of condition expressions called "key", in the first step, using an iterative method based on the quantity obtained from the syndrome. Available iterative methods include established algorisms such as a Euclid method and a BM (Berlekamp-Massey) method. In the subsequent second step, each element in the Galois field used in the solution searching polynomial $\Lambda(x)$ is substituted sequentially to seek an element that satisfies $\Lambda(x)=0$. This algorism is established as a Chien Search method. Thus, in the case of the $2^n$-BCH-ECC system, the first step needs the time for iterations until the solution searching polynomial $\Lambda(x)$ is obtained though it requires no enormous time.

Therefore, it can be realized with the iterative use of a small scale circuit. On the other hand, the second step can be realized with a small scale circuit though it requires an enormous processing time for scanning all elements in the Galois field. As above, in the $2^n$-BCH-ECC system, when batch-processed data is large, the processing time at the second step becomes a bottleneck and cannot realize real-time data access.

The $2^n$-RS-ECC system directly seeks coefficients of a solution searching polynomial $\Lambda(x)$, in the first step, using no iterative method. Therefore, the circuit scale becomes large though the processing time for obtaining the solution searching polynomial $\Lambda(x)$ can be made shorter. Further, in the second step, elements in the Galois field that can satisfy $\Lambda(x)=0$ are sought previously at a decoder to seek a solution through matching-by-decoder. Therefore, fast processing can be achieved independent of the number of elements in the Galois field. The circuit scale of the decoder becomes large in proportion to the number of elements in the Galois field and accordingly the circuit scale becomes enormous. As above, the $2^n$-RS-ECC system that realizes fast processing for on-chip has a larger circuit scale and therefore it is difficult to be used in those other than the special purpose memory systems that have priority to the processing speed.

In consideration of the above problems, an improved one is a lately-proposed p-LM-ECC system. The p-LM-ECC system can check and correct both burst errors and random errors, and further realizes a circuit scale and processing speed that can bear as an on-chip ECC system.

[Outline of Memory System]

An outline of a memory system according to the present embodiment is described herein.

Figure 2:
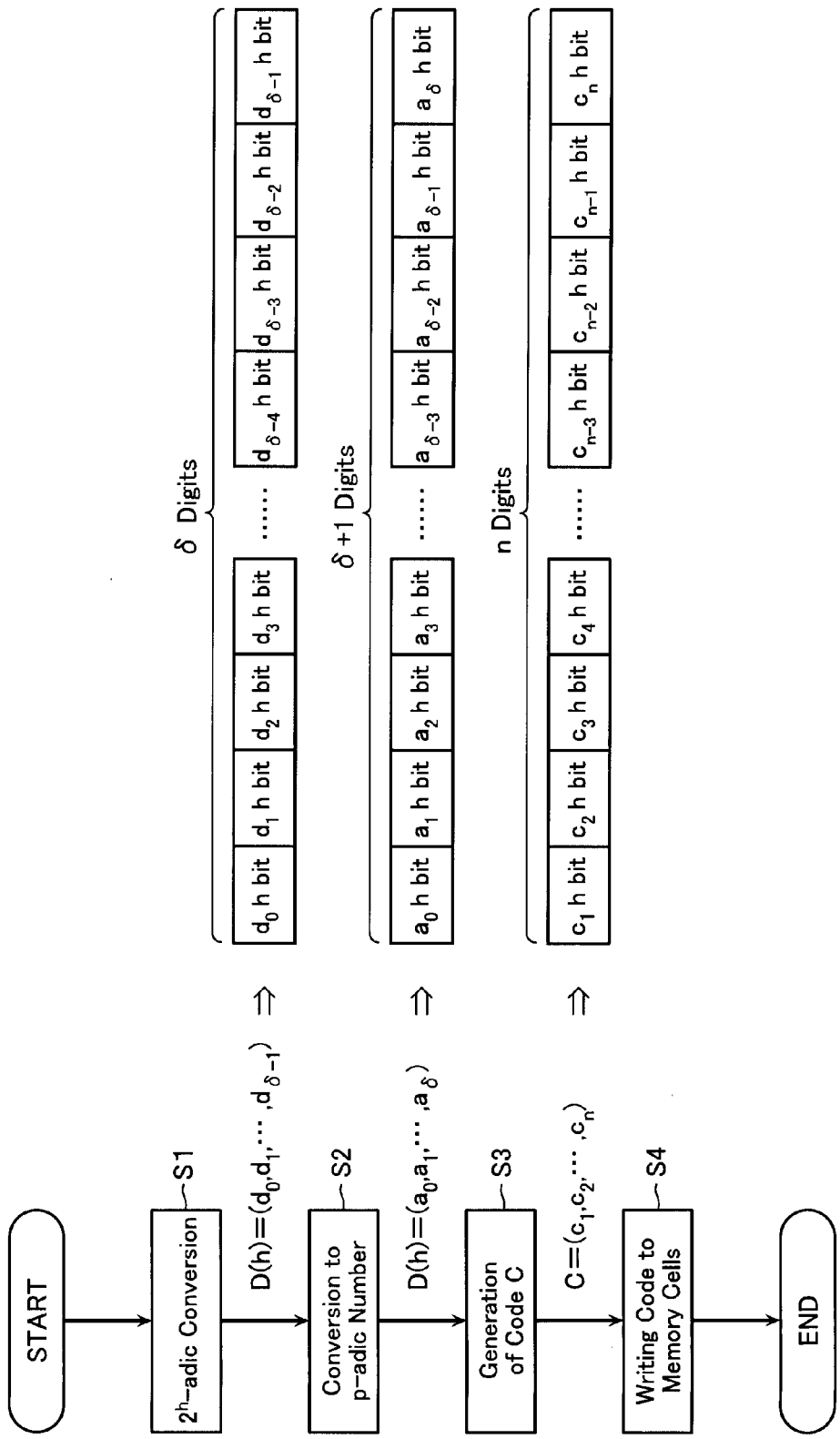
FIG. 2 is a diagram showing a flow of data writing in the present memory system.
Figure 3A:
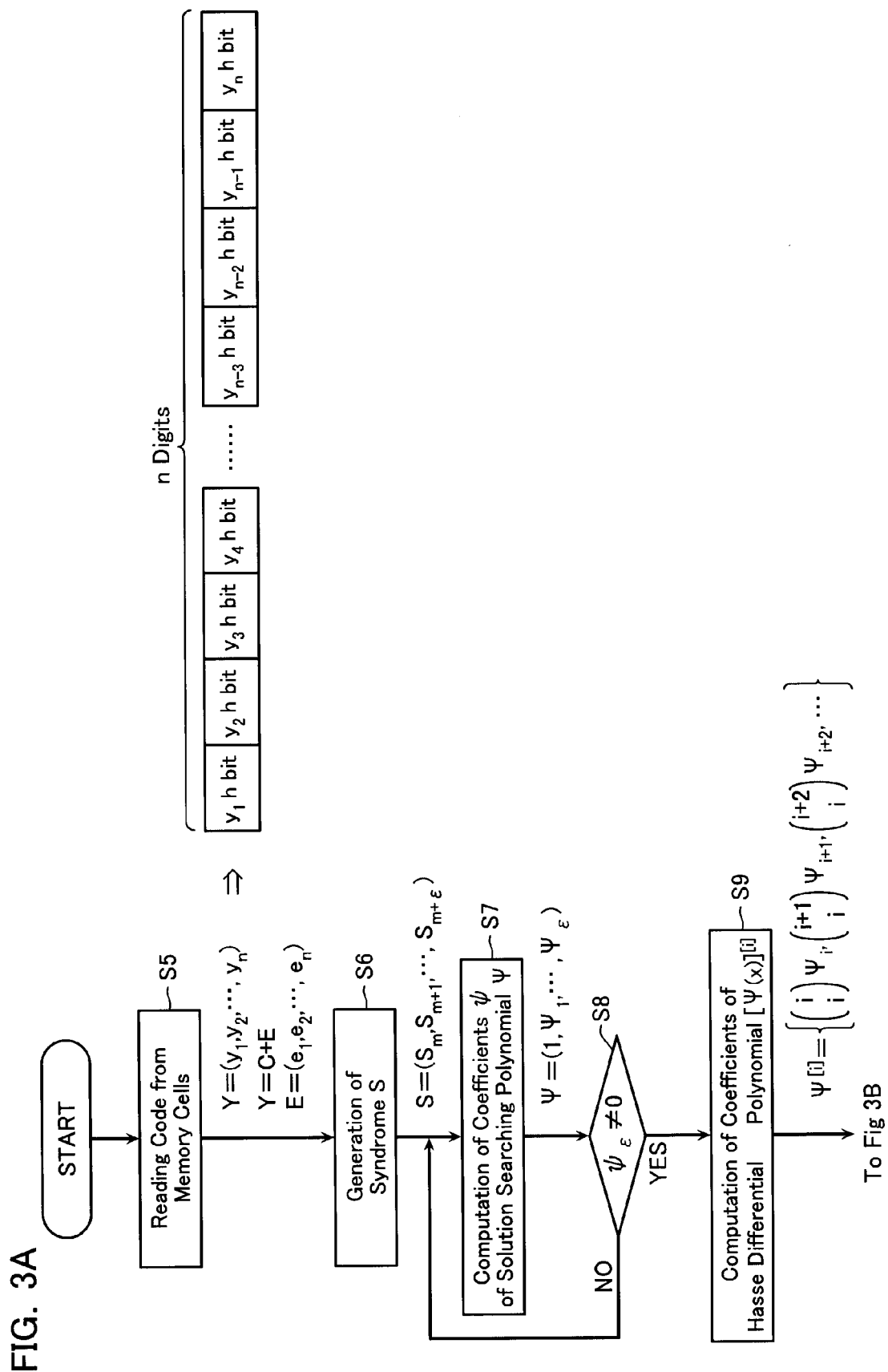
FIG. 3A is a diagram showing a flow of data reading in the present memory system.

FIG. 1 is a block diagram of the present memory system. FIG. 2 is a diagram showing a flow of data writing in the present memory system. FIGS. 3A and 3B are diagrams showing data reading in the present memory system.

The present memory system comprises a memory unit 100 and an ECC system 200 as roughly divided.

The memory unit 100 is a mass-storage memory such as a flash memory, a PRAM and a ReRAM. The ECC system 200 includes a p-adic number converter unit 201 and an encoder unit 202 on the data writing side to the memory unit 100. It also includes an error correcting unit (203-206), a decoder unit 207 and a binary converter unit 208 on the data reading side from the memory unit 100. The error correcting unit (203-206) contains a syndrome generator unit 203, a solution searching polynomial generator unit 204, a Hasse differential polynomial generator unit 205 and a code restorer unit 206. The ECC system 200 may be mounted on the same chip as the memory unit 100 or provided on a different chip from the memory unit 100.

Writing data to such the memory system can be performed as follows. First, data D fed from external is divided at every h bits in the p-adic number converter unit 201 to convert it to a $2^h$-adic expression (h is an integer) (S1 in FIG. 2) and then convert it to a p-adic expressed data word D(h) (p is a prime of 3 or more) (S2 in FIG. 2).

Subsequently, the encoder unit 202 applies a generator matrix G to the data word D(h) to generate a Lee metric code C (S3 in FIG. 2).

Finally, the Lee metric code C is recorded and held in the memory unit 100 (S4 in FIG. 2).

Reading data is performed as follows. First, an error containing code Y is read out of the memory unit 100 (S5 in FIG. 3A). The syndrome generator unit 203 applies a syndrome matrix H to the read code Y to generate a syndrome S (S6 in FIG. 3A).

Subsequently, the solution searching polynomial generator unit 204 seeks coefficients of a solution searching polynomial $\Psi(x)$ from the syndrome S to generate the solution searching polynomial $\Psi(x)$ (S7 in FIG. 3A).

Then, if the coefficients of the solution searching polynomial $\Psi(x)$ satisfy a certain condition (S8 in FIG. 3A), the Hasse differential polynomial generator unit 205 generates a Hasse differential polynomial $[\Psi(x)]^{[i]}$ for seeking a solution (S9 in FIG. 3A) to compute a root r thereof and the multiplicity n of the root (S10 in FIG. 3B).

Subsequently, the code restorer unit 206 uses the computed root r and the multiplicity n of the root to calculate the position of the error contained in the code Y and the error quantity to restore the code C (S11 in FIG. 3B).

Then, the decoder unit 207 reverse-converts the generator matrix G over the restored code C to regenerate the p-adic expressed data word D(h) (S12 in FIG. 3B).

Finally, the binary converter unit 208 converts the p-adic expressed data word D(h) to a $2^h$-adic expression and then provides it to external as binary data D (S13 in FIG. 3B).

The above steps of processing are described below in detail.

[Conversion to Code C]

The following description is given to the principle of conversion from the data D, which is fed from external, to the code C, which is to be recorded to the memory unit 100.

First, the necessity of the method of converting from the data D to the code C is described.

In the case of the use of GF(p), a prime p cannot be expressed with a power of 2. Therefore, different from the case of the use of $GF(2^n)$, all the bit patterns of the data D cannot be used as the code C as they are. Then, a conversion is required to assign the bit patterns of the data D to the elements of GF(p) one by one.

The elements of GF(p) are integers from 0 to p−1, all of which can be expressed with h-bit binaries. In this case, all bit patterns of h bits are not used. Therefore, h bits of the data D cannot be handled as the elements of GF(p) as they are.

Figure 4A:
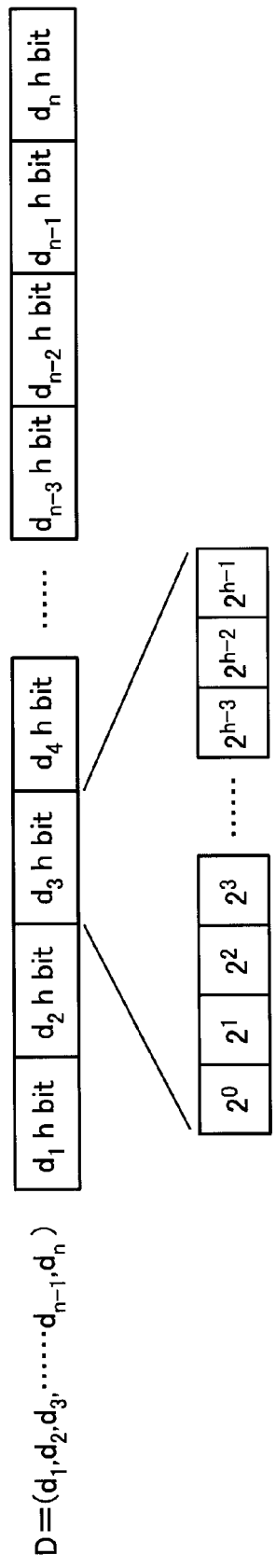
FIG. 4A is a diagram illustrative of an outline of conversion from data to a code in the present memory system.
Figure 4B:
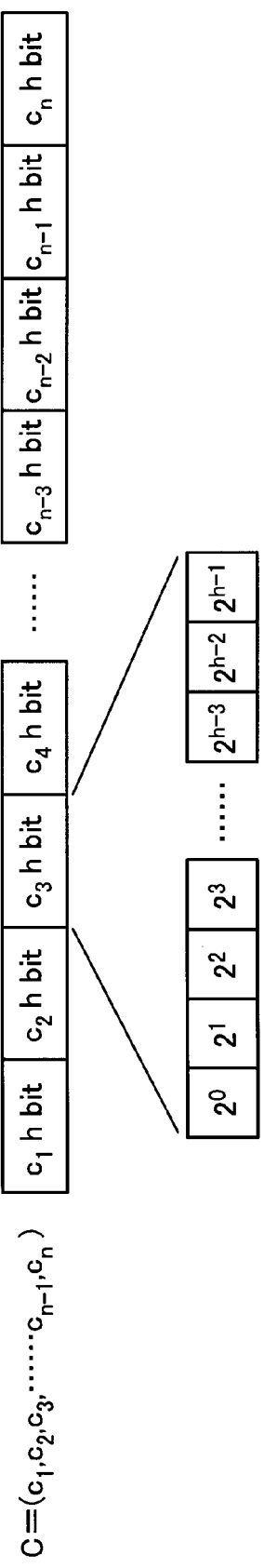
FIG. 4B is a diagram illustrative of an outline of conversion from data to a code in the present memory system.

As shown in FIG. 4A, when a set of data D given to the memory system is divided at every h bits (hereinafter a group of data at every h bits is referred to as a "data word symbol"), it can be viewed as an arrangement of n groups, that is, $2^h$-adic expressed, n-digit data $D=(d_1, d_2, \ldots, d_n)$. In this case, a bit pattern within a range below $2^h-1$ of all bit patterns of h bits appears on each digit. On the other hand, as shown in FIG. 4B, an n-word length GF(p) code $C=(c_1, c_2, \ldots, c_n)$ has a relation between the h-bit and the prime p that establishes $c_j < p < 2^h$. Accordingly, all bit patterns of h bits cannot appear.

Then, the conversion for assigning the data D to the code C one by one is required and it corresponds to a conversion from a $2^h$-adic expression to a p-adic expression.

The following description is given to a method of selecting a prime p for use in the conversion to a p-adic expression.

The number of bits of the data D batch-processed in the ECC system is expressed with M=δh. When the M-bit data D is converted to a δ-digit $2^h$-adic expression, it can be viewed as one data word D(h) as shown in Expression 1.

$$D(h) = d_{\delta-1}(2^h)^{\delta-1} + d_{\delta-2}(2^h)^{\delta-2} + \ldots + d_1(2^h)^1 + d_0(2^h)^0$$

$$0 < d_{\delta-1} < 2^h,\ 0 \leq d_j < 2^h \qquad \text{[Expression 1]}$$

Here, $d_{\delta-1}, d_{\delta-2}, \ldots, d_1, d^0$ denote values of $2^h$-adic expressions expressed by data word symbols (hereinafter a value expressed by a symbol is referred to as a "symbol value"). Take note that the symbol value $d_{\delta-1}$ on the highest digit δ−1 is a non-zero value.

Subsequently, the next condition on the p-adic conversion is set. Namely, when the maximum value and the minimum value in the numbers expressed with the data word D(h) are converted from h-bit binary expressions to p-adic expressions, the increase in the number of digits is limited to 1 digit at the maximum, as (δ+1) digits. Therefore, the p-adic expressed data word D(h) turns to (δ+1)-digit data shown in Expression 2.

$$D(h) = a_\delta(p)^\delta + a_{\delta-1}(p)^{\delta-1} + \ldots + a_1(p)^1 + a_0(p)^0$$

$$0 \leq a_j < p,\ a_\delta + a_{\delta-1} \neq 0 \qquad \text{[Expression 2]}$$

Here, $a_\delta, a_{\delta-1}, \ldots, a_1, a_0$ denote binary expressed symbol values. The symbol values $a_\delta$ and $a_{\delta-1}$ on the highest digit δ and the next digit δ−1 cannot take a zero value at the same time.

Subsequently, a relation between δ and h is sought, which makes it possible to configure the format of the data word D(h) ubiquitously. Namely, a condition is sought, under which a selection of h makes it possible to express 5 digits at the minimum. The minimum value $D_{min}(h)$ and the maximum value $D_{max}(h)$ of the data word D(h) are expressed as in Expression 3.

$$\text{Minimum:} D_{min}(h) = (2^h)^{\delta-1} \because d_{\delta-1}=1,\ d_j=0$$

$$\text{Maximum:} D_{max}(h) = (2^h)^\delta - 1 \because d_{\delta-1} = d_j = 2^h - 1 \qquad \text{[Expression 3]}$$

Therefore, $D_{min}(h)-1$ has (δ−1) digits and accordingly loses the format of the data word D(h). Then, when compared with a group of (h−1) bits, that is, a $2^{h-1}$-adic expression, and if $D_{min}(h)-1 \geq D_{max}(h-1)$ can be established, even the expression of the data word D(h) does not lower the number δ of digits. In a word, the relation between δ and h can be shown in Expression 4.

$$\delta \geq h \because (2^h)^{\delta-1}-1 \geq (2^{h-1})^\delta - 1 \qquad \text{[Expression 4]}$$

Subsequently, a condition is sought, under which the increase in the number of digits on a p-adic expression becomes 1 digit at the maximum. When the maximum value $D_{max}(h)$ is viewed in relation to a modulus of $p^\delta$ or $p^{\delta+1}$, it is given as Expression 5.

$$D_{max}(h)(\bmod\ p^\delta) \neq D_{max}(h)(\bmod\ p^{\delta+1}) = D_{max}(h)(\bmod\ p^{\delta+2}) = \ldots \because (p)^\delta \leq (2^h)^\delta - 1 < (p)^{\delta+1} \qquad \text{[Expression 5]}$$

Here, each side of Expression 5 can be expressed with an integer. Accordingly, it is possible to establish $(p)^\delta < (2^h)^\delta$ and $(2^h)^\delta \leq (p)^{\delta+1}$. Therefore, a prime p falls within a range as shown in Expression 6.

$$(2^h)^{\delta/(\delta+1)} \leq p < 2^h \qquad \text{[Expression 6]}$$

Further, $\delta/(\delta+1) = (1-1/\delta)/(1+(1/\delta)^2) < 1 - 1/\delta < 1 - 1/h$ ($h \leq \delta$) and p are primes. Accordingly, one of the conditions for selecting a prime p can be expressed as shown in Expression 7. Here, to the minimum value $p^{\delta-1}$ of a δ-digit, p-adic number, $p^{\delta-1} < (2^h)^{\delta-1} = D_{min}(h)$ can be established. Therefore, no p-adic number becomes less than (δ-1) digits.

$$2^{h-1} < p < 2^h \qquad \text{[Expression 7]}$$

Subsequently, to the condition for selecting a prime p obtained through Expression 7, a condition for realizing a Lee metric code is added.

In the p-adic expression of the data word D(h), the Lee metric code of GF(p) can be used to generate a code C having a condition as shown in Expression 8 over (δ+1) symbol values where n denotes a word length of the code C (namely, $C=(c_1, c_2, \ldots, c_n)$), which includes a dummy word length K, a data word length k, and the maximum value $\epsilon = \gamma - 1$ of the sums of Lee metrics of correctable errors.

$$n=p-1,\ d_L(C) \geq 2\gamma,\ k=n-\gamma,\ k=\kappa+\delta+1 \qquad \text{[Expression 8]}$$

Here, $d_L(C)$ denotes the minimum Lee distance between code words.

Subsequently, as the data D batch-processed in the ECC system has M bits, the data D can be considered as groups of appropriate h bits and viewed as a δ-digit number so that it can be converted to a (δ+1)- or lower-digit p-adic number. Namely, δ+1 corresponds to the data word length of the Lee metric code. In a word, the Lee metric code cannot be created unless δ+1≤k. Thus, the selection of a prime p is processed while determining the word length κ so as to satisfy δ+1+κ=k and giving a fixed value (for example, 0) to the code word having the word length κ. Accordingly, in relation to δ+1+κ=k and k=p-ϵ-2, one of the conditions for selecting a prime p is given as Expression 9.

$$\delta + \epsilon + 3 + \kappa = p,\ 0 \leq \kappa \qquad \text{[Expression 9]}$$

In summary, when the maximum value of the sums of Lee metrics of correctable errors required in the ECC system is E and the data length of the batch-processed data D is M bits, as δh≥M, and δ+ϵ+3+κ=p (0≤κ), a condition for selecting a prime p is given as Expression 10.

$$p \geq \frac{M}{h} + \epsilon + 3 + \kappa \qquad \text{[Expression 10]}$$

AND $$2^{h-1} < p < 2^h$$

Further, the prime p to be selected is one having the minimum dummy word length κ of the primes p that satisfy the condition shown in Expression 10, that is, a prime p that minimizes κ=p-δ-ϵ-3. For information, δ is the minimum integer more than M/h.

Here, a redundant word length γ as the code C on GF(p) is γ=ϵ+1=n-k=n-(κ+δ+1). Accordingly, a redundant word length (n-δ) viewed from the number of digits of the data word D(h) becomes n-δ=κ+1+γ. Therefore, a redundant bit length viewed from the data word D(h) is given as Expression 11.

$$h(n-\delta) = h(\gamma + 1 + \kappa) \qquad \text{[Expression 11]}$$

In a word, a selection of a prime p having the minimum word length K of the primes p that satisfy Expression 10 makes it possible to reduce the redundant word length (n-δ) most.

The following description is given to a method of converting the input data D to a Lee metric code C. Prior to that description, the Lee metric code for use in the present embodiment is described. Hereinafter, each digit contained in the code is referred to as a "code word symbol".

A code word symbol c is an integer shown in Expression 12.

$$c \in GF(p) = Zp,\ 0 \leq c < p \qquad \text{[Expression 12]}$$

When Lee metrics of these integers are denoted with |c|, and all Lee metrics |c| are represented by integers smaller than p/2, the Lee metrics |c| are defined by Expression 13.

$$0 \leq c < \frac{p}{2}: |c| = c \qquad \text{[Expression 13]}$$
$$\frac{p}{2} < c < p: |c| = p - c$$

As the code C can be considered a row of n (=p-1) code word symbols, it can be represented by $C=(c_1, c_2, \ldots, c_n)$ as shown in FIG. 4B, and a metric w(C) of the code C can be defined as the sum of Lee metrics |c| of the code word symbols as shown in Expression 14.

$$w(C) = |c_1| + |c_2| + \ldots + |c_n| \qquad \text{[Expression 14]}$$

The distance between codes is defined by the sum of Lee metrics of differences between the code word symbols corresponding to the code. Here, a difference between 2 codes C and Y (Lee distance) $d_L(C, Y)$ is given as Expression 15.

$$d_L(C, Y) = w(C - Y) \qquad \text{[Expression 15]}$$

Further, the minimum Lee distance of the code C can be defined by the minimum metric of the metrics w(C) of the code C as shown in Expression 16.

$$d_L(C) = \min w(C) \qquad \text{[Expression 16]}$$

Here, the Lee metric code is a code that has the minimum distance of 2γ between codes having a generator matrix G and a syndrome matrix H shown in Expression 17 and that can correct Lee metric errors lower than γ-1.

$$G = \begin{bmatrix} 1 & 2 & \ldots & (p-1) \\ 1^2 & 2^2 & \ldots & (p-1)^2 \\ \vdots & \vdots & \ddots & \vdots \\ 1^k & 2^k & \ldots & (p-1)^k \end{bmatrix},$$ [Expression 17]

$$H = \begin{bmatrix} 1 & 2 & \ldots & (p-1) \\ 1^1 & 2^1 & \ldots & (p-1)^1 \\ \vdots & \vdots & \ddots & \vdots \\ 1^{\gamma-1} & 2^{\gamma-1} & \ldots & (p-1)^{\gamma-1} \end{bmatrix}$$

Here, when the number of symbols in the code C is n and the number of symbols in the data word D is k, then γ=n−k, and γ represents the number of redundant symbols contained in the code C.

The following description is given to a method of encoding the data D fed to the memory system to the Lee metric code C.

First, an M (=δh)-bit binary batch-processed in the ECC system, or data D, is converted to a (δ+1)-digit p-adic expression. At that time, if there is a shortage of κ digits than previously set γ, the κ digits are fixed to 0, for example. The κ-digit numbers thus obtained become elements x of GF(p).

Subsequently, with a data word X (X=($x_1, x_2, \ldots, x_k$)), an operation C=XG is executed to obtain the code C.

Finally, code word symbols $c_i$ contained in the code C thus obtained are stored in memory cells as binary-expressed h-bit data as shown in Expression 18.

$$c_i = \alpha_0^j + \alpha_1^j \cdot 2 + \ldots + \alpha_{h-1}^j \cdot 2^{h-1},$$ [Expression 18]

$$\alpha_m^j \in (0, 1)$$

$$c_i = \sum_{j=1}^{k} (i)^j x_j$$

[Error Correction of Code Y]

Here, the principle of error correction for an error-containing code Y is described.

First, prior to the description of error correction for the code Y in the present memory system, a comparison example of error correction is described.

Binary data of the code C recorded in memory cells includes a set of n code word symbols each composed of h bits and causes variations on receipt of various disturbances at every bit. Therefore, a code word symbol c to be stored originally may vary to an unintended code word symbol y. The code C can be restored from the code Y containing the code word symbol y through error correction.

Prior to error correction, it is required to seek a syndrome S.

The code Y containing the varied code word symbol y can be represented as Expression 19.

$$Y = (y_1, y_2, \ldots, y_n)$$

$$y_i = c_i + e_i,\ e_i = \epsilon_0^i + \epsilon_1^i \cdot 2 + \ldots + \epsilon_{h-1}^i \cdot 2^{h-1},\ \epsilon_m^i \in (0,1)$$ [Expression 19]

Here, $e_i$ denotes the error quantity in each code word symbol $c_i$.

The syndrome S can be sought as elements $S_0, S_1, \ldots, S_{\gamma-1}$ shown in Expression 20 through an operation S=YH$^t$ using a syndrome matrix H.

$$\sum_{j=1}^{p-1} (j)^1 c_j = \sum_{i=0}^{k} x^i \sum_{j=0}^{p-1} (j)^{1+i} = 0 \therefore S_1 = \sum_{j=1}^{p-1} (j)^1 e_j,$$ [Expression 20]

$$S_0 = \sum e_j$$

Here, H$^t$ is a transpose of H. The generator matrix G and the syndrome matrix H are configured to satisfy GH$^t$=0 (mod p). Accordingly, a representation of Y=C+E yields S=EH$^t$. With E=($e_0, e_1, \ldots, e_n$), a syndrome $S_0$ is the total sum of errors in the code word symbols as can be found. These syndromes S provide the only information on errors and, on the basis of these syndromes S, the correct code C is restored as follows.

Next, the principle of decoding is described on the assumption that the situation of errors has been identified previously. Here, n(=p−1) error code word symbols are classified into 2 sets $J_+$ and $J_-$ as shown in Expression 21.

$$J_+ = \{j \in (1,2,\ldots,n);\ e_j < p/2\}$$

$$J_- = \{j \in (1,2,\ldots,n);\ e_j > p/2\}$$ [Expression 21]

Namely, if the error quantity in the error code word symbol is $e_j<p/2$, it is classified into $J_+$ that is an arrangement of the positions j of the code word symbols $c_j$ and $J_-$ that is an arrangement of the positions j of the code word symbols $c_j$ when the error quantity in the error code word symbol is $e_j>p/2$. Polynomials Λ(x), V(x) on GF(p) are configured on the basis of these sets as Expression 22.

$$\Lambda(x) = \prod_{j \in J_+} (1 - jx)^{e_j},$$ [Expression 22]

$$V(x) = \prod_{j \in J_-} (1 - jx)^{p-e_j}$$

Thus, the polynomial Λ(x) is a polynomial that has a reciprocal number of the position j of an error code word symbol in $J_+$ as a root and that has a Lee metric $e_j$ of that error code word symbol as the multiplicity of the root. On the other hand, the polynomial V(x) is a polynomial that has a reciprocal number of the position j of an error code word symbol in $J_-$ as a root and that has a Lee metric p−$e_j$ of that error code word symbol as the multiplicity of the root. Decoding is a process of finally configuring these polynomials only from the information on the syndrome $S_1$ to solve them, thereby obtaining information on errors. In a word, it is required to seek a relation between these polynomials Λ(x), V(x) and the syndrome $S_1$.

Subsequently, as shown in Expression 23, when it is configured with a series polynomial having each syndrome $S_1$ on a coefficient of the corresponding degree, it is represented with a rational polynomial having the error quantity $e_j$ of the code word symbol, the position j and the value thereof.

$$S(x) = \sum_{l=1}^{\infty} S_l x^l = \sum_{j=1}^{p-1} e_j \sum_{l=1}^{\infty} (jx)^l = \sum_{j=1}^{p-1} e_j \frac{jx}{1-jx}$$ [Expression 23]

From Expression 23, a relational expression shown in Expression 24 can be established among the polynomials Λ(x), V(x) and the syndrome S(x).

$$\left(\frac{\Lambda(x)}{V(x)}\right)S(x) = -x\left(\frac{\Lambda(x)}{V(x)}\right)'  \quad \text{[Expression 24]}$$

Subsequently, the relational expression shown in Expression 24 is used to seek the polynomials $\Lambda(x)$, $V(x)$ from the syndrome $S(x)$.

From the syndrome $S(x)$, a polynomial $\Psi(x)$ with a degree of $\gamma-1$ or lower shown in Expression 25 is sought.

$$\Psi(x)S(x) \equiv -x\Psi'(x) (\bmod x^\gamma) \quad \text{[Expression 25]}$$

$$\Psi(x) = 1 + \sum_{l=1} \psi_l x^l,$$

$$\psi_j = -\frac{1}{j}\sum_{i=1}^{j} \psi_{j-i} S_i$$

In an expansive expression of the polynomial $\Psi(x)$, a coefficient $\phi_j$ can be sought from a comparison between coefficients of the homogeneous degree on both sides of the expression shown in Expression 25 through an iterative method using the syndrome $S_i$ and an already-sought coefficient $\psi_{j-1}$. Coefficients $\psi_0$ to $\psi_{\gamma-1}$ of the polynomial $\Psi(x)$ are sought from syndromes $S_1$ to $S_{\gamma-1}$. The results are shown in Expression 26.

$$\psi_0 = 1 \quad \text{[Expression 26]}$$
$$\psi_1 = -\psi_0 S_1 = -S_1$$
$$\psi_2 = -(\psi_1 S_1 + \psi_0 S_2)/2$$
$$\vdots$$
$$\psi_{\gamma-1} = -(\psi_{\gamma-2} S_1 + \ldots + \psi_0 S_{\gamma-1})/(\gamma-1)$$

The polynomial $\Psi(x)$ is a polynomial equivalent to $\Lambda(x)/V(x)$ while the polynomials $\Lambda(x)$, $V(x)$ are given key conditions shown in Expression 27. Therefore, it can be sought through a Euclid iterative method applied to $x^\gamma$ and the polynomial $\Psi(x)$ to eliminate constant multiples.

$$V(x)\Psi(x) \equiv \Lambda(x) (\bmod x^\gamma)$$

$$\deg \Lambda(x) + \deg V(x) < \gamma$$

$\Lambda(x)$ and $V(x)$ are mutually primes $$\deg \Lambda(x) - \deg V(x) \equiv S_0 (\bmod p) \quad \text{[Expression 27]}$$

Therefore, if the polynomial $\Psi(x)$ can be configured from the syndromes $S_1$ to $S_{\gamma-1}$, the syndrome $S_0$ can be used as a condition precedent for the iterative method to seek the polynomials $\Lambda(x)$, $V(x)$. Namely, the polynomials $\Lambda(x)$, $V(x)$ sought from the set of $(S_0, \Psi(x))$ through the iterative method can represent the position $j$ and the error quantity $e_j$ of an error code word symbol.

Subsequently, the Euclid iterative method is described. The following description is given to an iterative method of seeking a congruence equation, $V(x)\Psi(x) \equiv \Lambda(x) (\bmod x^\gamma)$, with a condition precedent, $\deg \Lambda(x) - \deg V(x) \equiv S_0 (\bmod p)$.

The Euclid iterative method is a method of sequentially seeking functions $f_0, f_1, \ldots, f_n$ using divisions of polynomials. These quantities have relations shown in Expression 28.

$$f_0 = k_0 f_1 + f_2, \quad \text{[Expression 28]}$$
$$f_1 = k_1 f_2 + f_3, \ldots, f_n = k_n f_{n+1} + f_{n+2}$$
$$p_{-1} = 0, p_0 = 1, p_n = k_{n-1} p_{n-1} + p_{n-2}$$
$$q_0 = 0, q_1 = 1, q_n = k_{n-1} q_{n-1} + q_{n-2}$$

$$p_n f_n + p_{n-1} f_{n+1} = (k_{n-1} p_{n-1} + p_{n-2}) f_n + p_{n-1} f_{n+1}$$
$$= p_{n-1}(k_{n-1} f_n + f_{n+1}) + p_{n-2} f_n$$
$$= p_{n-1} f_{n-1} + p_{n-2} f_n$$
$$\vdots$$
$$= p_0 f_0 + p_{-1} f_1$$
$$= f_0$$

$$q_n f_n + q_{n-1} f_{n+1} = (k_{n-1} q_{n-1} + q_{n-2}) f_n + q_{n-1} f_{n+1}$$
$$= q_{n-1}(k_{n-1} f_n + f_{n+1}) + q_{n-2} f_n$$
$$= q_{n-1} f_{n-1} + q_{n-2} f_n$$
$$\vdots$$
$$= q_1 f_1 + q_0 f_2$$
$$= f_1$$

$$f_0 = p_n f_n + p_{n-1} f_{n+1},$$
$$f_1 = q_n f_n + q_{n-1} f_{n+1}$$

$$\begin{vmatrix} p_n & p_{n-1} \\ q_n & q_{n-1} \end{vmatrix} = \begin{vmatrix} k_{n-1} p_{n-1} & p_{n-1} \\ k_{n-1} q_{n-1} & q_{n-1} \end{vmatrix} =$$

$$-\begin{vmatrix} p_{n-1} & p_{n-2} \\ q_{n-1} & q_{n-2} \end{vmatrix} \to p_n q_{n-1} - p_{n-1} q_n =$$

$$(-1)^{n-1}(p_1 q_0 - p_0 q_1) = (-1)^n,$$

$$f_n = (-1)^n (q_{n-1} f_0 - p_{n-1} f_1) \therefore$$

$$f_n \equiv (-1)^{n+1} p_{n-1} \Psi (\bmod x^\gamma),$$

$$f_0 = x^\gamma, f_1 = \Psi$$

Here, as shown in Expression 29, when $p_n$ or $q_n$ can be sequentially introduced from a quotient polynomial $k_n$ particularly obtained through the process of division, these polynomials can satisfy a simple relation. Accordingly, $f_n$ can be represented by $f_0$, $f_1$, $p_{n-1}$ and $q_{n-1}$. Then, when $f_0 = x^\gamma$, $f_1 = \Psi(x)$ are established to create a congruence equation at $x^\gamma$, the iterative condition precedent turns to $\deg f_n - \deg p_{n-1} \equiv S_0 (\bmod p)$. With regard to n that satisfies the condition precedent, if $\deg f_n + \deg p_{n-1} < \gamma$, then $\lambda(x) = f_n$, $V(x) = p_{n-1}$ can be established.

Subsequently, a search is made for a solution that establishes $\Lambda(x) = 0$, $V(x) = 0$.

The polynomials $\Lambda(x)$, $V(x)$ shown in Expression 22 can be turned to a polynomial shown in Expression 29 if $f(x) = \Lambda(x)$ (or $V(x)$) is established.

$$f(x) = 1 + f_1 x + f_2 x^2 + \ldots + f_{\gamma-1} x^{\gamma-1} \quad \text{[Expression 29]}$$

In solution searching, elements $1, \ldots, p-1$ of $Zp$ are sequentially substituted into x of $f(x)$ to determine x that makes $f(x) = 0$ in relation to a modulus of p, that is, to seek a root r that establishes $f(r) = 0 (\bmod p)$. Once the root r is determined, an inverse element of the root r in $GF(p)$, that is, $r^{-1}$ turns to the position j of the error code word symbol ($j = r^{-1}$), and the multiplicity e of the root r turns to the Lee metric $e_j$ of the error code word symbol.

Here, searching for the multiplicity of the root r is described. In searching for the multiplicity e of the root r, first, the coefficients and binomial coefficients of the polynomials $\Lambda(x)$, $V(x)$ are used to obtain a Hasse differential polynomial shown in Expression 30.

$$[f(x)]^{[m]} = \sum_{i=m}^{\gamma-1} \binom{i}{m} f_i x^{i-m} \qquad \text{[Expression 30]}$$

Subsequently, a root is substituted into the Hasse differential polynomial shown in Expression 30 to find a differential rank e that does not become zero first. This rank e is the multiplicity of the root r.

$$[f(r)]^{[e-1]} = 0, \ [f(r)]^{[e]} \neq 0 \qquad \text{[Expression 31]}$$

Next, error correction for the code Y in the embodiment is described.

The above-described conventional method of configuring the solution searching polynomial uses the Euclid iterative method and accordingly requires divisions of polynomials, which complicate the computational process. Further, the error quantity obtained from the sought polynomial is limited to one restricted by the degree of the polynomial. Therefore, the error quantity is fixed to the polynomial obtained through the iterative method. Then, the present embodiment uses a method obtained by simplifying the method of configuring the solution searching polynomial and additionally improving the degree of freedom on error searching.

In the conventional method, the value of the syndrome $S_0$ is the condition precedent for seeking a solution. Therefore, depending on the situation of errors, the syndrome $S_0$ cannot satisfy the condition precedent and no solution may be obtained. In the present embodiment, errors caused in the code word symbols are converted in batch so that a solution can be obtained in such the situation of errors. When products are made among fixed elements in a finite field and all elements, all elements in the finite field are obtained again. This fact is used to obtain u in relation to a previously determined element $\eta$ as $uS_0 \equiv \eta$. When the error-containing code Y stored in the memory is multiplied by this u to seek syndromes, $uS_0$, $uS_1, \ldots, uS_{\gamma-1}$ are obtained as shown in Expression 32.

$$\sum_{j=1}^{p-1}(j)^l c_j = \sum_{i=0}^{k} x^i \sum_{j=0}^{p-1} (j)^{l+i} = 0 \therefore uS_1 = \sum_{j=1}^{p-1} (j)^l u e_j, \qquad \text{[Expression 32]}$$

$$\eta = uS_0 = \sum u e_j$$

Here, take note that the total sum of the converted errors is $\eta$. The principle of decoding in the present embodiment has a difference in handling uE instead of the error code E from the principle of decoding in the conventional method. This difference can simplify the conventional method of seeking the polynomials $\Lambda(x)$, $V(x)$ as follows.

Hereinafter, the error correcting method in the present embodiment is referred to as the "syndrome converting method".

First, a method of introducing the polynomials $\Lambda(x)$, $V(x)$ from the syndrome $S(x)$ is described.

With regard to configuring the polynomial $\Psi(x)$ from the syndrome $S(x)$, it is same in the syndrome converting method as the conventional method. It is different, though, that the syndrome to be used is uS. In a word, a polynomial $\Psi(x)$ of the degree of $\gamma-1$ or lower can be sought in the syndrome converting method as Expression 33.

$$\Psi(x)S(x) \equiv -x\Psi'(x)(\bmod x^\gamma) \qquad \text{[Expression 33]}$$

$$\Psi(x) = 1 + \sum_{l=1}^{} \psi_l x^l,$$

$$\psi_j = -\frac{1}{j} \sum_{i=1}^{j} \psi_{j-i} u S_i$$

Therefore, when the coefficients $\psi_0$ to $\psi_{\gamma-1}$ of the polynomial $\Psi(x)$ are sought, the results are as shown in Expression 34.

$$\psi_0 = 1 \qquad \text{[Expression 34]}$$
$$\psi_1 = -\psi_0 u S_1 = -u S_1$$
$$\psi_2 = -(\psi_1 u S_1 + \psi_0 u S_2)/2 = -u(\psi_1 S_1 + \psi_0 S_2)/2$$
$$\vdots$$
$$\psi_{\gamma-1} = -(\psi_{\gamma-2} u S_1 + \ldots + \psi_0 u S_{\gamma-1})/$$
$$(\gamma - 1) = -u(\psi_{\gamma-2} S_1 + \ldots + \psi_0 S_{\gamma-1})/(\gamma - 1)$$

The key conditions for the solution searching polynomial are shown in Expression 35. The polynomials $\lambda(x)$, $v(x)$ that can satisfy these key conditions meet the polynomials $\Lambda(x)$, $V(x)$, respectively, except the constants.

$$V(x)\Psi(x) \equiv \lambda(x)(\bmod x^\gamma)$$

$$\deg \lambda(x) - \deg v(x) = \eta = uS_0 (\bmod p)$$

$$\deg \lambda(x) + \deg v(x) < \gamma \qquad \text{[Expression 35]}$$

As shown in Expression 35, the key conditions for the solution searching polynomial in the syndrome converting method are different from those for the conventional method in that the condition stipulated by the syndrome $S_0$ related to the degree is stipulated by previously determined $\eta$. Stipulation of the condition by previously determined $\eta$ in this way yields deg $v(x) = 0$ if $\gamma - 1 - \leq 1$ because the conditions related to the degree of the polynomial, deg $\lambda(x)$ − deg $v(x) = \eta$, deg $\lambda(x)$ + deg $v(x) \leq \gamma - 1$, result in $0 \leq 2\deg v(x) \leq \gamma - 1 - \eta$ as can be found. Namely, when $\eta$ is set within a range of $\gamma - 1 \geq \eta \geq \gamma - 2$, the solution searching polynomial can be introduced without the use of the Euclid iterative method. Actually, in the case of the condition of deg $\Psi(x) = \eta$, the polynomial $\Psi(x)$ is the only solution searching polynomial that can satisfy all the key conditions. This method corresponds to conduction of conversions to all error code word symbols to collect the positions j thereof into the collection $j_+$. In other word, if the total sum $S_0$ of errors is other than a multiple of a prime p, the total sum $S_0$ of errors is converted to $\gamma - 1$ or $\gamma - 2$ to indicate the possibility of error correction. It is the possibility to the last, however, and error correction needs conditions that all errors are collected into $J_+$ and the degree of the polynomial $\Psi(x)$ sought from the syndrome uS is equal to $\eta$.

As for errors in 1 symbol, the syndrome converting method can support any errors as described later. As for errors in 2 symbols as well, it can support any errors if the syndrome S is used cyclically.

Next, in solution searching, $\Lambda(x) = \Psi(x)$, $V(x) = 1$ are established to find a solution from elements in Zp, similar to the conventional method. In the syndrome converting method, however, the multiplicity of the obtained root is in the form of the product with u. Accordingly, it is required to multiply the multiplicity by $u_{-1}$ to obtain errors.

In the syndrome converting method, η is set based on γ. Therefore, there are the cases of η=γ−1 and η=γ−2 though only η=γ−1 is considered in the following description.

Next, with regard to a method of converting metrics of errors to seek a solution searching polynomial, a study is made on which types of errors can be searched over the number of roots (the number of error-caused code word symbols) using the syndrome converting method.

In a first case, 1 root is obtained from the solution searching polynomial. This case is described below.

If the root is $j^{-1}$, then the position of the error-caused code word symbol is j, and the actual error quantity is $e_j$. In this case, once multiplied by an appropriate u for conversion, the multiplicity of the root is always $ue_j$=η independent of the error quantity $e_j$. Therefore, the errors in 1 symbol can be obtained completely as a solution.

In a second case, 2 roots are obtained from the solution searching polynomial. This case is described below.

If the roots are $i^{-1}$ and $j^{-1}$, then the positions of the error-caused code word symbols are i and j, and the actual error quantities are $e_i$ and $e_j$ (E=(0, . . . , $e_i$, . . . , $e_j$, . . . , 0), n=p−1). In this case, once multiplied by an appropriate u for conversion so that these can be each arranged into $J_+$ below p/2, a polynomial Ψ(x) shown in Expression 36 can be configured. Therefore, the error quantities can be sought from the polynomial Ψ(x).

$$uS_1 = i^1 ue_i + j^1 ue_j \therefore \Psi(x) = (1-ix)^{ue_i}(1-jx)^{ue_j}$$ [Expression 36]

Here, once multiplied by an appropriate u for conversion of the error quantities for the purpose of arranging these into $J_+$, the error quantities $e_i$ and $e_j$ are required to have a certain relation therebetween. It is sufficient for that purpose if both are equal to each other, and this allows the conversion by u to make any error quantities reach η(η=γ−1). Therefore, the errors in 2 symbols can be obtained completely as a solution.

Next, a converting method capable of equalizing the error quantities in 2 symbols is described in detail.

The positions of error-caused 2 code word symbols in the code Y are denoted with i, j and the error quantities are denoted with $e_i$, $e_j$, respectively. In this case, the syndrome $S_0$ is represented by $S_0 = e_i + e_j$. In general, a syndrome $S_m$ is represented by $S_m = i^m e_i + j^m e_j$. In a word, a selection of an appropriate m can establish $i^m e_i \equiv j^m e_j$.

Here, the use of the primitive root and the exponential indication of GF(p) to provide $e_i = \alpha^{(ei)}$, $e_j = \alpha^{(ej)}$, $i = \alpha^{(i)}$, $j = \alpha^{(j)}$ can establish $m(i)+(e_i) \equiv m(j)+(e_j)$. Therefore, m can be sought from $m \equiv -\{(e_j)-(e_i)\}/\{(j)-(i)\}$.

From the above, a series of syndromes ($S_m, S_{m+1}, \ldots, S_{m+\gamma}$) can be used to seek a coefficient u that establishes $uS_m$=η.

Originally, m is indistinct. Therefore, in order to support various errors in 2 code word symbols, a converting method as described below is used. Initially, m is scanned from 0 to p−2 to compute a coefficient u for each m by $u = \eta S_m^{-1}$. This allows ($uS_m, uS_{m+1}, \ldots, uS_{m+\eta}$) to be sought. Next, from these ($uS_m, uS_{m+1}, \ldots, uS_{m+\eta}$), a polynomial Ψ(x) is configured. Finally, m that satisfies deg Ψ(x)=η is extracted from the configured polynomial Ψ(x). A selection of m thus extracted makes it possible to equalize the converted error quantities $ue_i$, $ue_j$ in 2 code word symbols.

In a third case, 3 or more roots are obtained from the solution searching polynomial. This case is described below.

When 3 or more roots are obtained from the solution searching polynomial Ψ(x), obtaining a solution requires a condition that converts the error quantities of all roots so as to belong to $J_+$. When this condition is provided, the polynomial Ψ(x) is configured as the η-order polynomial. When there are 3 or more roots, however, it is difficult to configure a simple converting method for supporting various errors.

Then, when there are 3 or more roots, such a converting method is used that increases the times of arranging the error quantities of all roots into $J_+$ after conversion. On each m for η=γ−1 and η=γ−2, this converting method applies the same converting method as that for 2 roots or less. Namely, while increasing m from 0 to p−2 in turn, the following is performed when $S_m \neq 0$. Initially with η=γ−1, then with η=γ−2, a coefficient q is computed in accordance with $q \equiv \eta S_m^{-1}$. This makes it possible to seek ($qS_m, qS_{m+1}, \ldots, qS_{m+\gamma-1}$). Next, from these ($qS_m, qS_{m+1}, \ldots, qS_{m+\gamma-1}$), the polynomial Ψ(x) is configured. If the polynomials Ψ(x) thus configured include a polynomial Ψ(x) that satisfies deg Ψ(x)=η, a solution can be obtained from the polynomial Λ(x). On the other hand, if all the polynomials Ψ(x) result in deg Ψ(x)≠η, the error distribution is insoluble. Therefore, the method is terminated as no solution.

The solving method includes the solving methods for 2 roots and 1 root. Thus, it is possible to seek all errors if there are 2 roots or less. On the other hand, if there are 3 roots or more, it is possible to seek errors under a special condition that, for example, the distribution of the error quantities is narrow. Specifically, if the error quantities of all errors are equal or if the error quantities of others than 1 error are equal, it is possible to seek errors in all code word symbols. In particular, if the error quantities of all error code word symbols are equal, it is possible to seek errors in the maximum η symbols.

The use of η=γ−1 and η=γ−2 can exactly increase the times of arranging the error distributions of 3 or more error code word symbols into $J_+$ though the types of error distributions are not clear in which a solution can be obtained. As the minimum Lee metric between code words is 2γ, it is possible to correct errors from the solution if the errors are less than γ−1.

[Application to Memory System]

Here, the above-described principle of conversion to the code C and error correction of the code Y is described on an application to an actual memory system.

Here, described is an example of the p-LM-ECC system applied to a specific memory system.

First, a relation between the number of error symbols and the error quantity in the correctable case is described. Here, described is a relation between burst errors and bit errors when memory cells store information on a bit basis.

The code C is stored as binary in memory cells and accordingly errors E in the code differ depending on the positions of error bits. The Lee metric code handles burst errors and accordingly has a restriction on errors that can be supported as bit errors. Specifically, as a data word symbol is represented by an h-bit binary, 1 bit error on the $2^0$ position has the error quantity of ±1 (1 or p−1 in Zp), and 1 bit error on the $2^{h-1}$ position has the error quantity of $\pm 2^{h-1}$ (mod p). Therefore, in order to support the patterns of all bit errors, it is required to support all the error quantities in the code word symbols.

As described above, the use of the solution searching method of the present embodiment makes it possible to seek a solution for errors over any error quantities if the error code word symbols are 2 or below. In a word, when bit errors arise in burst, it is possible to exactly support the bursts if they are 2 or below.

Figure 5:
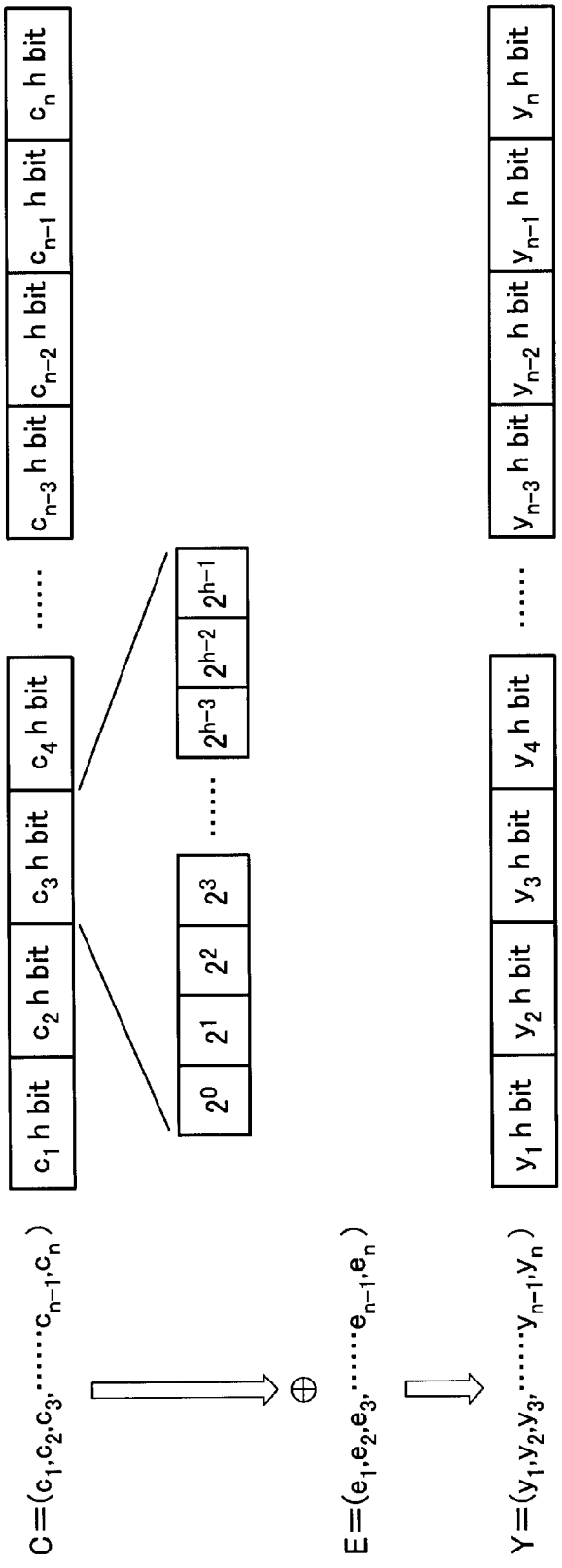
FIG. 5 is a diagram showing a relation between a bit error and a symbol in the present memory system.

The code C can be stored in memory systems configured in various manners if the code word symbols c can be binary-converted as shown in FIG. 5. In the present embodiment, however, when the characteristic of the error correcting method is taken into account, a desirable memory system is configured using memory cells capable of storing multi-values in accordance with physical quantity levels (hereinafter simply referred to as "levels"). In this case, it is possible to achieve data storage with the order of the level of a memory cell corresponding to the magnitude of the symbol value, which can decrease the error-caused fluctuations in Lee metrics. This is because mostly errors arise when they move from the correct level to the vicinity of that level.

Next, with regard to a memory system using multi-value storage memory cells, a method of assigning symbol values to levels of memory cells is described.

Memory cells such as flash memories, PRAMs, ReRAMs can store multi-values with the physical quantity levels corresponding to the quantities of data. In this case, the levels normally do not fluctuate so large and accordingly, even if errors arise, they are small errors of the several levels.

When GF(p) is used as in the present embodiment, it is convenient if the symbol value corresponds to the magnitude of the level. When 2 memory cells configure multi-levels, however, the manner of taking a representative q of Zp is considered as $-2/p<q<p/2$. This is because an increased prime p can reduce the proportion of a redundant symbol to the entire code and accordingly the number of levels is increased as large as possible to take a larger value of the prime p.

The following description is given to an example of the way of assigning the symbol values of $-(p-1)/2$ to $(p-1)/2$ to the levels of 2 memory cells MC1, MC2. Here, the memory cells MC1, MC2 are assumed to have $2^{h-2}$ levels each.

First, the way of assigning the symbol value of 0 is described.

With regard to the assignment of the symbol value of 0, the following 2 rules are determined.

(Rule 1) If the levels of the memory cells MC1, MC2 are both at the lowermost level, the symbol value is 0.

(Rule 2) If the levels of the memory cells MC1, MC2 are both at the second lowest level, the symbol value is 0.

If the symbol value is 0, it is recorded on the basis of the rule 1 as a rule while the rule 2 is also determined in consideration of the level shift caused as a result of the error occurrence.

Next, the way of assigning symbol values other than 0 is described.

Figure 6:
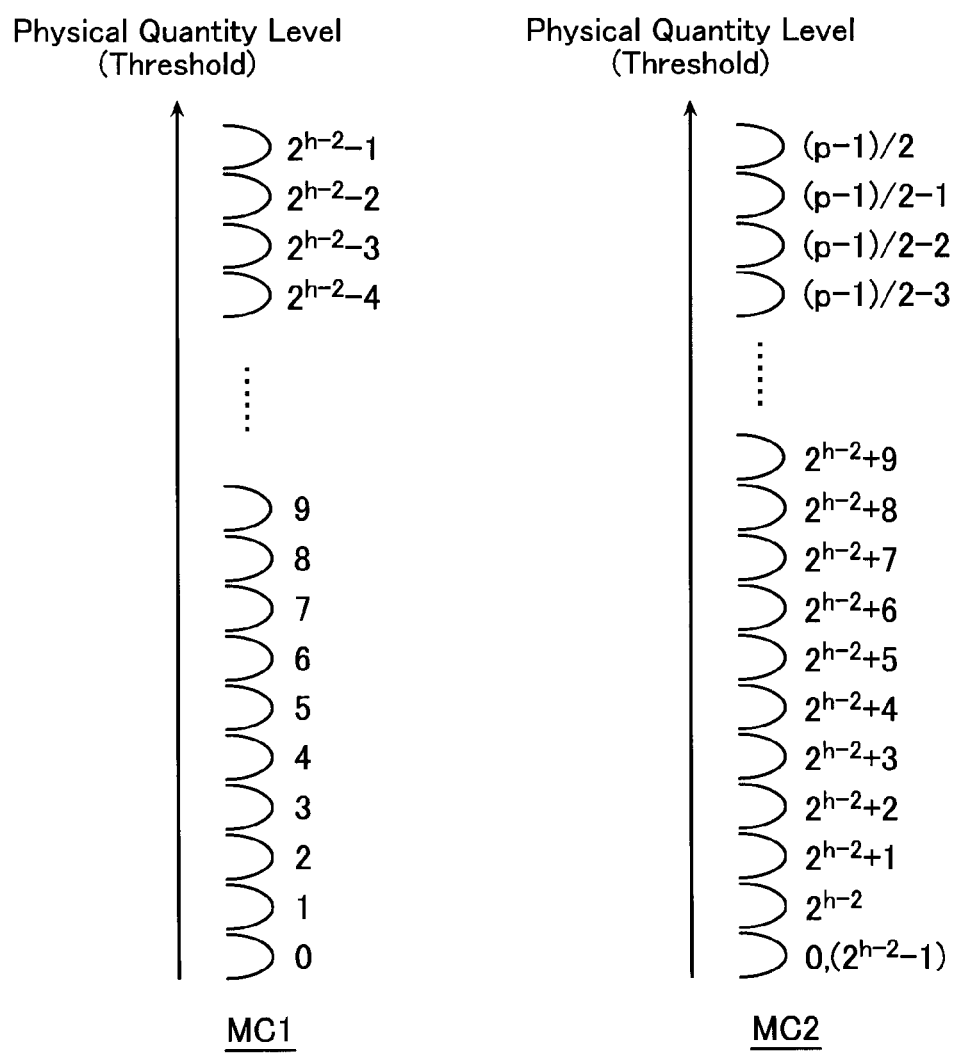
FIG. 6 is a diagram showing relations between levels and symbol values when one symbol is recorded in 2 multi-level cells in the present memory system.

The symbol values of 1 to $(p-1)/2$ are assigned to the second lowest level of the memory cell MC1 through the uppermost level of the memory cell MC2 as shown in FIG. 6. Take note that the uppermost level of the memory cell MC1 and the lowermost level of the memory cell MC2 are the symbol value of $2^{h-2}-1$ and thus, for convenience, the same symbol value is assigned.

The symbol values of $-(p-1)/2$ to $-1$ are assigned to the second lowest level of the memory cell MC2 through the uppermost level of the memory cell MC1. This is achieved by creating negative numbers having the absolute values of the symbol values shown in FIG. 6 and exchanging the roles of the memory cells MC1, MC2.

Take note that, for convenience, the same symbol value is assigned. Take note that the uppermost level of the memory cell MC2 and the lowermost level of the memory cell MC1 are the symbol value of $-2^{h-2}+1$ and thus, for convenience, the same symbol value is assigned.

As described above, each level of the memory cells MC1, MC2 is assigned with 2 symbol values and accordingly the following rules are determined to take either symbol value.

(Rule 3) If the symbol values are 1 to $2^{h-2}-1$, the memory cell MC2 is kept at the lowermost level. An actual symbol value is represented by the memory cell MC1.

(Rule 4) If the symbol values are $2^{h-2}$ to $(p-1)/2$, the memory cell MC2 is kept at the uppermost level. An actual symbol value is represented by the memory cell MC2.

(Rule 5) If the symbol values are $-2^{h-2}+1$ to $-1$, the memory cell MC1 is kept at the lowermost level. An actual symbol value is represented by the memory cell MC2.

(Rule 6) If the symbol values are $-(p-1)/2$ to $-2^{h-2}$, the memory cell MC2 is kept at the uppermost level. An actual symbol value is represented by the memory cell MC1.

The correspondence of the level of the memory cell MC to the symbol value is actually executed in an input/output system that changes a code word symbol to a binary expression on the memory system and converts it for the correspondence of the level of the memory cell MC at a read/write circuit to the memory system.

As 2 memory cells MC1, MC2 are used, these memory cells MC1, MC2 are configured in a complementary pair of multi-values and may be used as reference memory cells mutually on reading and writing. Thus, the introduction of the way of thinking the reference level in addition to the level of the memory cell MC is not the essence of the present embodiment and the description is omitted though the association of the level of the memory cell to the symbol value can be expanded easily.

Next, based on the premise of the symbol value assignment as above, several error-occurrence patterns are verified. The errors handled herein have levels that are shifted upward or downward by one, and it is assumed that they are errors caused by code reading and writing, and due to the deterioration of the storage condition. In FIGS. 7-11, a thick solid line indicates a level in the correct condition, and a thin solid line indicates a level in the case of the error occurrence.

Figure 7:
FIG. 7 is a diagram showing errors caused when one symbol is recorded in 2 multi-level memory cells in the present memory system.
Figure 7:
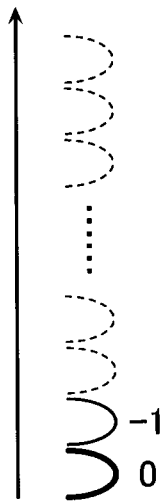
Figure 7:
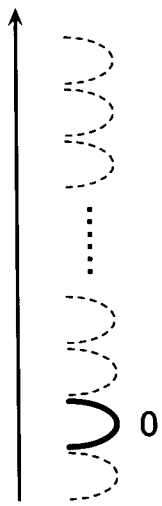
Figure 7:
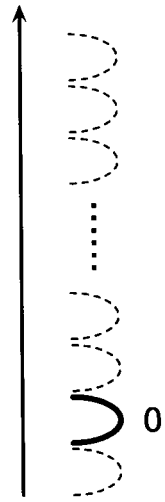

FIG. 7 is a diagram showing errors caused when the symbol value of 0 is recorded.

In accordance with the rule 1, the symbol value of 0 is assigned to the condition of the memory cells MC1, MC2 both at the lowermost level. Therefore, if an error occurs only in the memory cell MC1, the symbol value after the error occurrence turns to 1 as shown in the upper figure of FIG. 7. In this case, the error quantity becomes +1. If an error occurs only in the memory cell MC2, the symbol value after the error occurrence turns to $-1$ as shown in the upper figure of FIG. 7. In this case, the error quantity becomes $-1$. On the other hand, if errors occur in both the memory cells MC1, MC2, the symbol value of 0 is read in accordance with the rule 2 as shown in the lower figure of FIG. 7. From the above, the errors caused when the symbol value is 0 can fall within a range of the error quantities of ±1.

Figure 8A:
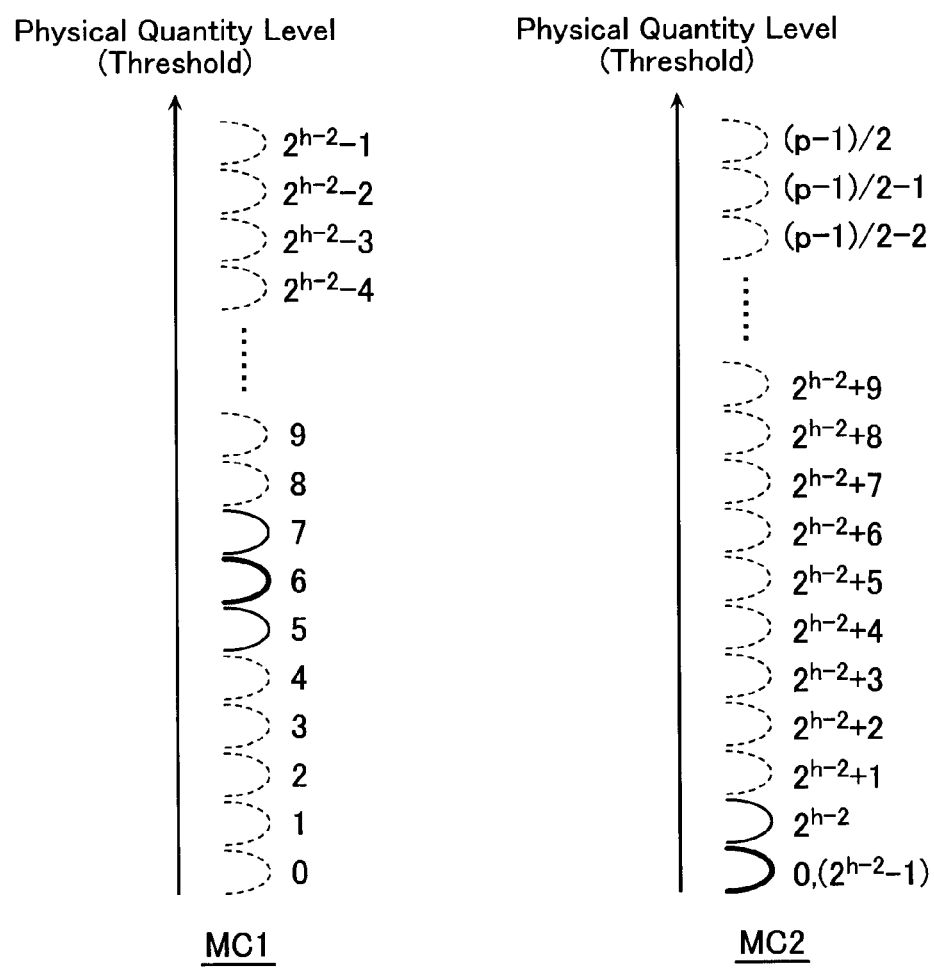
FIG. 8A is a diagram showing errors caused when one symbol is recorded in 2 multi-level memory cells in the present memory system.

FIG. 8A is a diagram showing errors caused when a general symbol value or a symbol value of 6 is recorded.

If an error occurs only in the memory cell MC1, the symbol value after the error occurrence turns to 5 or 7. In this case, the error quantity becomes ±1. If an error occurs only in the memory cell MC2, the symbol value after the error occurrence turns to $2^{h-2}$ when only the memory cell MC2 is considered. As the memory cell MC1 is at the middle level, however, the symbol value indicated by the memory cell MC2 is neglected. Therefore, the symbol value becomes 6, which is indicated by the memory cell MC1. In this case, the error quantity becomes 0. Even if errors occur in both the memory cells MC1, MC2, the error quantity becomes ±1 because the symbol value of the memory cell MC2 is neglected. From the above, the errors caused when the symbol value is 6 can fall within a range of the error quantities of ±1.

Figure 8B:
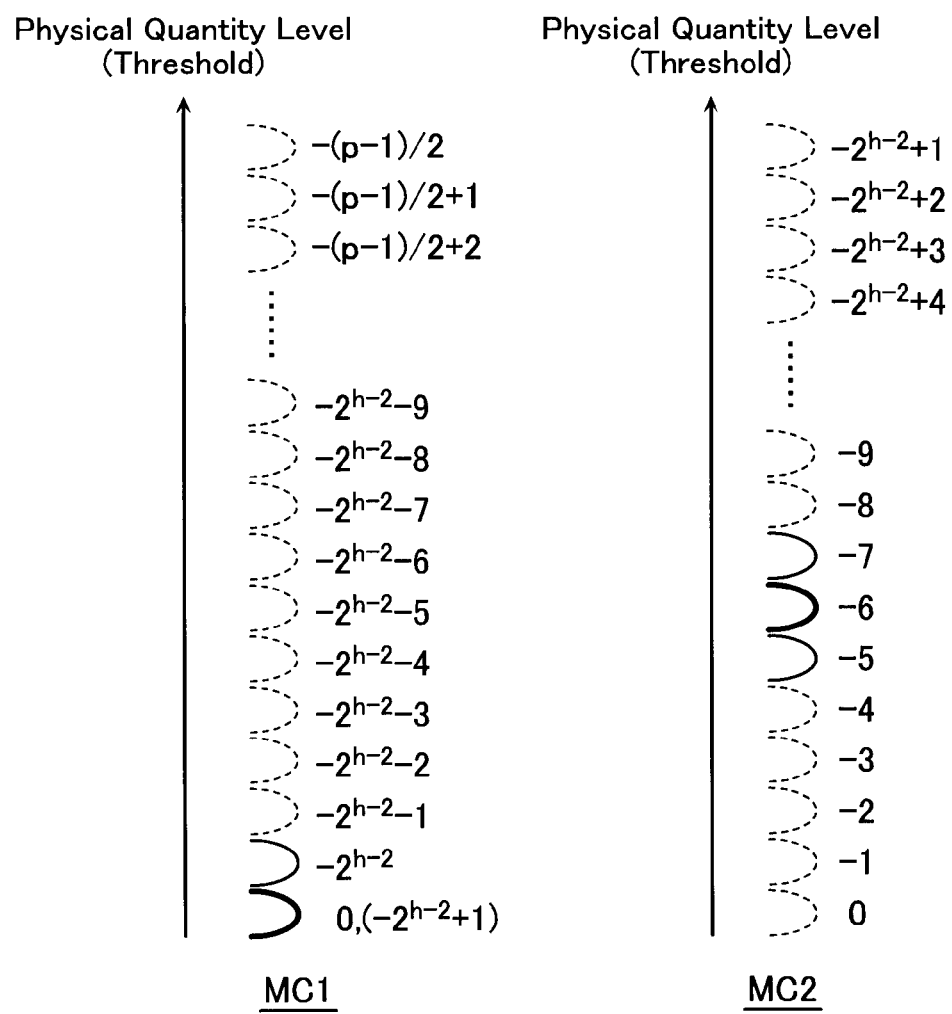
FIG. 8B is a diagram showing errors caused when one symbol is recorded in 2 multi-level memory cells in the present memory system.

FIG. 8B is a diagram showing errors caused when a general symbol value or a symbol value of $-6$ is recorded.

If an error occurs only in the memory cell MC2, the symbol value after the error occurrence turns to −5 or −7. In this case, the error quantity becomes ±1. If an error occurs only in the memory cell MC1, the symbol value after the error occurrence turns to $-2^{h-2}$ when only the memory cell MC1 is considered. As the memory cell MC2 is at the middle level, however, the symbol value indicated by the memory cell MC1 is neglected. Therefore, the symbol value becomes −6, which is indicated by the memory cell MC2. In this case, the error quantity becomes 0. Even if errors occur in both the memory cells MC1, MC2, the error quantity becomes ±1 because the symbol value of the memory cell MC1 is neglected. From the above, the errors caused when the symbol value of −6 is recorded can fall within a range of the error quantities of ±1.

Figure 9A:
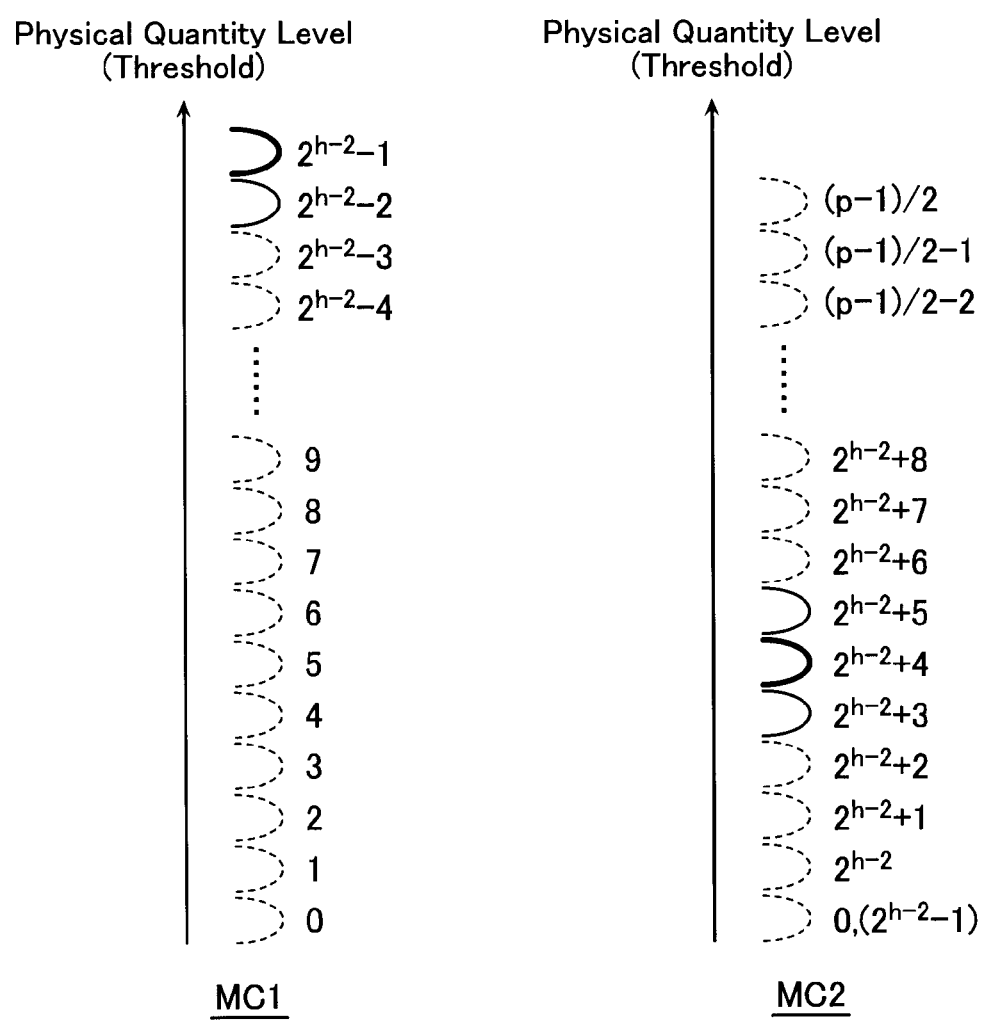
FIG. 9A is a diagram showing errors caused when one symbol is recorded in 2 multi-level memory cells in the present memory system.

FIG. 9A is a diagram showing errors caused when a general symbol value or a symbol value of $2^{h-2}+4$ is recorded.

If an error occurs only in the memory cell MC2, the symbol value after the error occurrence turns to $2^{h-2}+3$ or $2^{h-2}+5$. In this case, the error quantity becomes ±1. If an error occurs only in the memory cell MC1, the symbol value after the error occurrence turns to $2^{h-2}-2$ when only the memory cell MC1 is considered. As the memory cell MC2 is at the middle level, however, the symbol value indicated by the memory cell MC1 is neglected. Therefore, the symbol value becomes $2^{h-2}+4$, which is indicated by the memory cell MC2. In this case, the error quantity becomes 0. Even if errors occur in both the memory cells MC1, MC2, the error quantity becomes ±1 because the symbol value of the memory cell MC1 is neglected. From the above, the errors caused when the symbol value of $2^{h-2}+4$ is recorded can fall within a range of the error quantities of ±1.

Figure 9B:
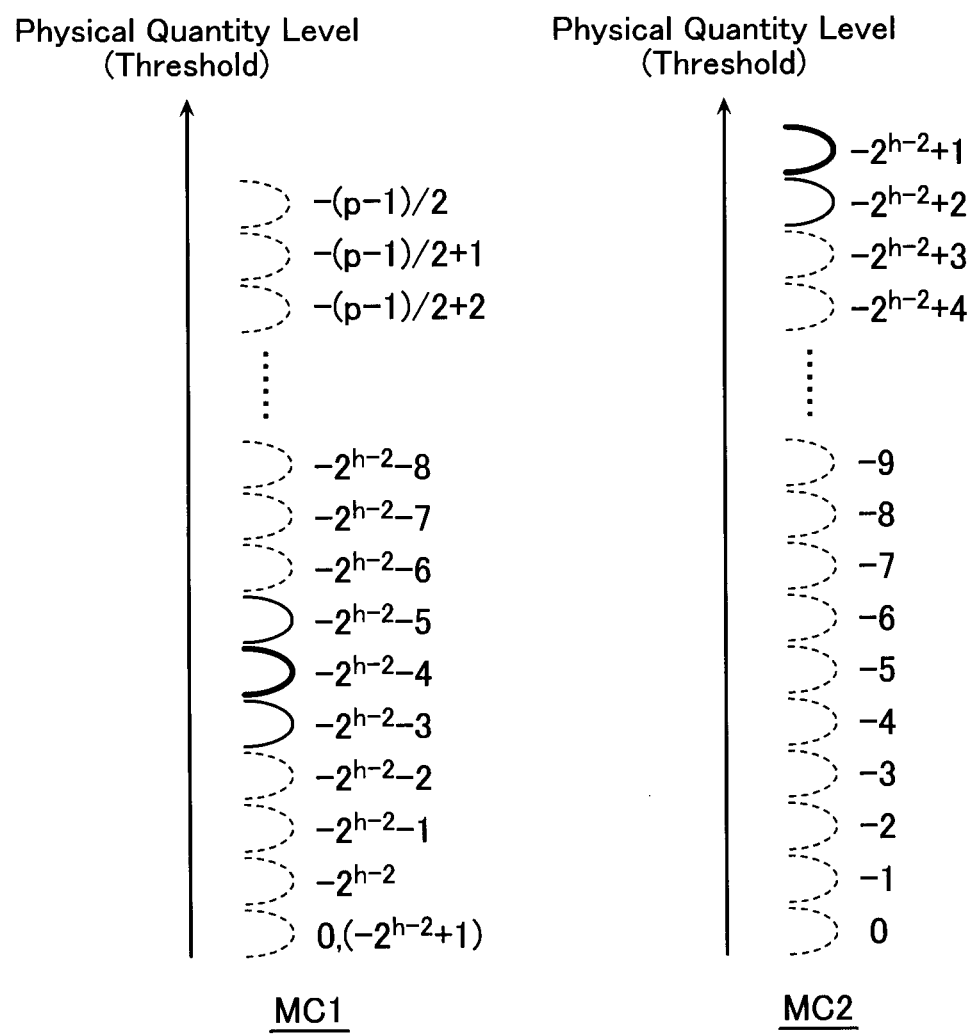
FIG. 9B is a diagram showing errors caused when one symbol is recorded in 2 multi-level memory cells in the present memory system.

FIG. 9B is a diagram showing errors caused when a general symbol value or a symbol value of $-2^{h-2}-4$ is recorded.

If an error occurs only in the memory cell MC1, the symbol value after the error occurrence turns to $2^{h-2}-3$ or $2^{h-2}-5$. In this case, the error quantity becomes ±1. If an error occurs only in the memory cell MC2, the symbol value after the error occurrence turns to $-2^{h-2}+2$ when only the memory cell MC2 is considered. As the memory cell MC1 is at the middle level, however, the symbol value indicated by the memory cell MC2 is neglected. Therefore, the symbol value becomes $-2^{h-2}-4$, which is indicated by the memory cell MC2. In this case, the error quantity becomes 0. Even if errors occur in both the memory cells MC1, MC2, the error quantity becomes ±1 because the symbol value of the memory cell MC2 is neglected. From the above, the errors caused when the symbol value of $-2^{h-2}-4$ is recorded can fall within a range of the error quantities of ±1.

Figure 10A:
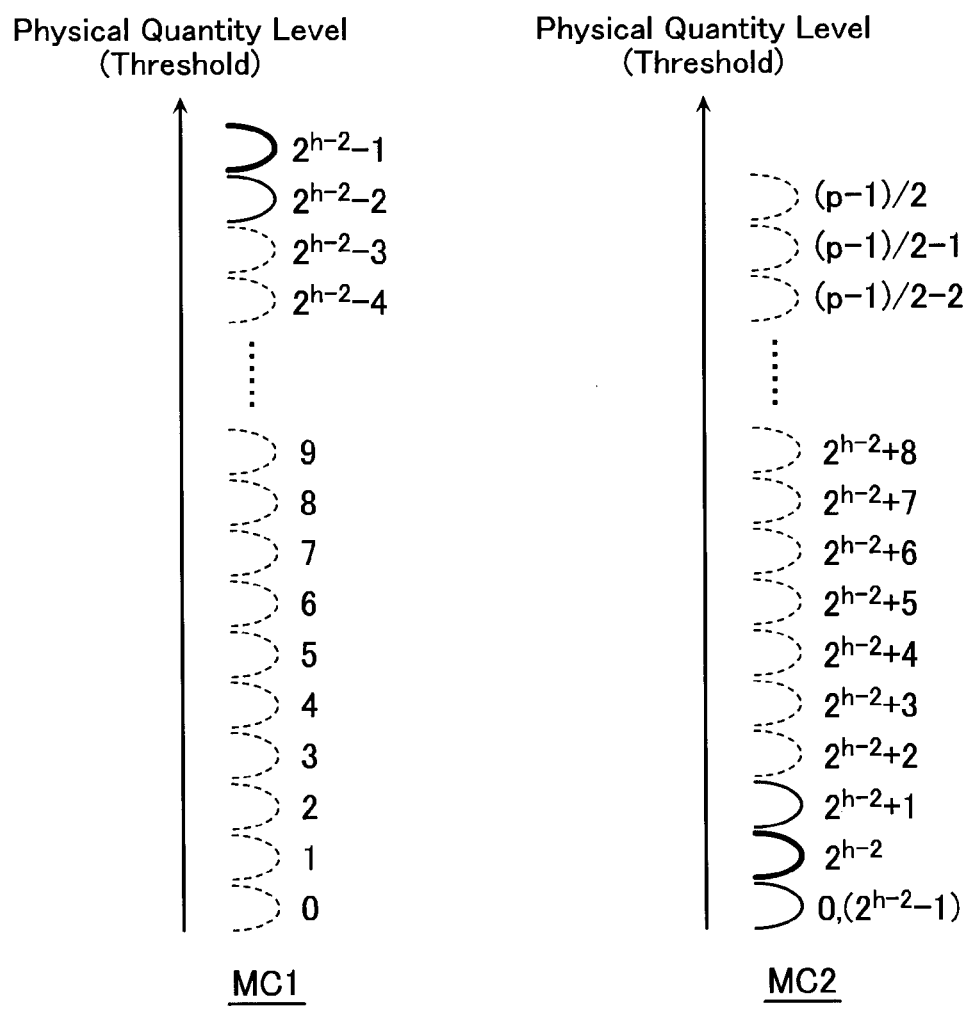
FIG. 10A is a diagram showing errors caused when one symbol is recorded in 2 multi-level memory cells in the present memory system.

FIG. 10A is a diagram showing errors caused when a symbol value of $2^{h-2}$ assigned to the boundary between the memory cells MC1, MC2 or the vicinity is recorded.

If an error occurs only in the memory cell MC2, the symbol value after the error occurrence turns to $2^{h-2}+1$ or $2^{h-2}-1$. In this case, the error quantity becomes ±1. If an error occurs only in the memory cell MC1, the symbol value after the error occurrence turns to $2^{h-2}-2$ when only the memory cell MC1 is considered. As the memory cell MC2 is at the middle level, however, the symbol value indicated by the memory cell MC1 is neglected. Therefore, the symbol value becomes $2^{h-2}$, which is indicated by the memory cell MC2. In this case, the error quantity becomes 0. On the other hand, if errors occur in both the memory cells MC1, MC2 and the memory cell MC2 is at the lowermost level, the symbol value after the error occurrence becomes $2^{h-2}-2$. In this case, the error quantity becomes −2. From the above, the errors caused when the symbol value of $2^{h-2}$ is recorded can fall within a range of the error quantities of −2 to +1.

Figure 10B:
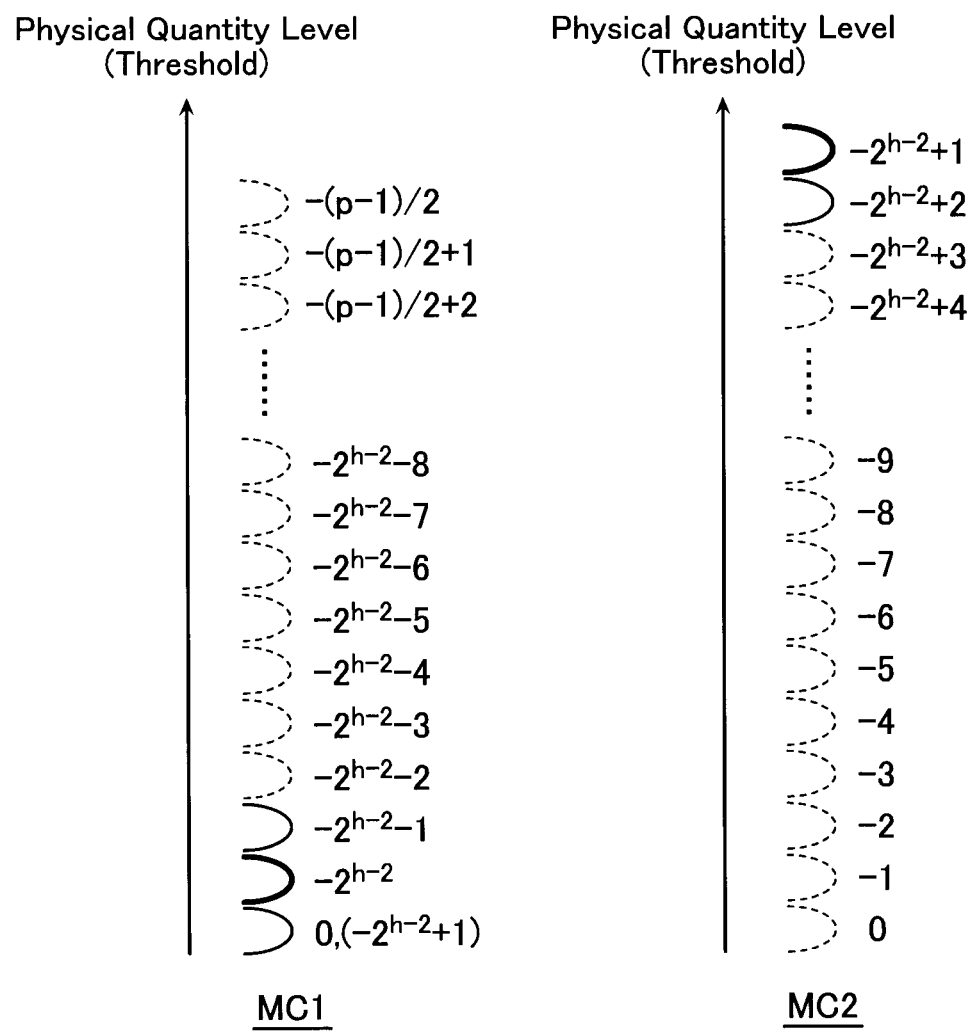
FIG. 10B is a diagram showing errors caused when one symbol is recorded in 2 multi-level memory cells in the present memory system.

FIG. 10B is a diagram showing errors caused when a symbol value of $-2^{h-2}$ assigned to the boundary between the memory cells MC1, MC2 or the vicinity is recorded.

If an error occurs only in the memory cell MC1, the symbol value after the error occurrence turns to $-2^{h-2}-1$ or $-2^{h-2}+1$. In this case, the error quantity becomes ±1. If an error occurs only in the memory cell MC2, the symbol value after the error occurrence turns to $-2^{h-2}+2$ when only the memory cell MC2 is considered. As the memory cell MC1 is at the middle level, however, the symbol value indicated by the memory cell MC2 is neglected. Therefore, the error quantity becomes $-2^{h-2}$, which is indicated by the memory cell MC1. In this case, the error quantity becomes 0. On the other hand, if errors occur in both the memory cells MC1, MC2 and the memory cell MC1 is at the lowermost level, the symbol value after the error occurrence becomes $-2^{h-2}+2$. In this case, the error quantity becomes +2. From the above, the errors caused when the symbol value of $-2^{h-2}$ is recorded can fall within a range of the error quantities of −1 to +2.

Figure 11A:
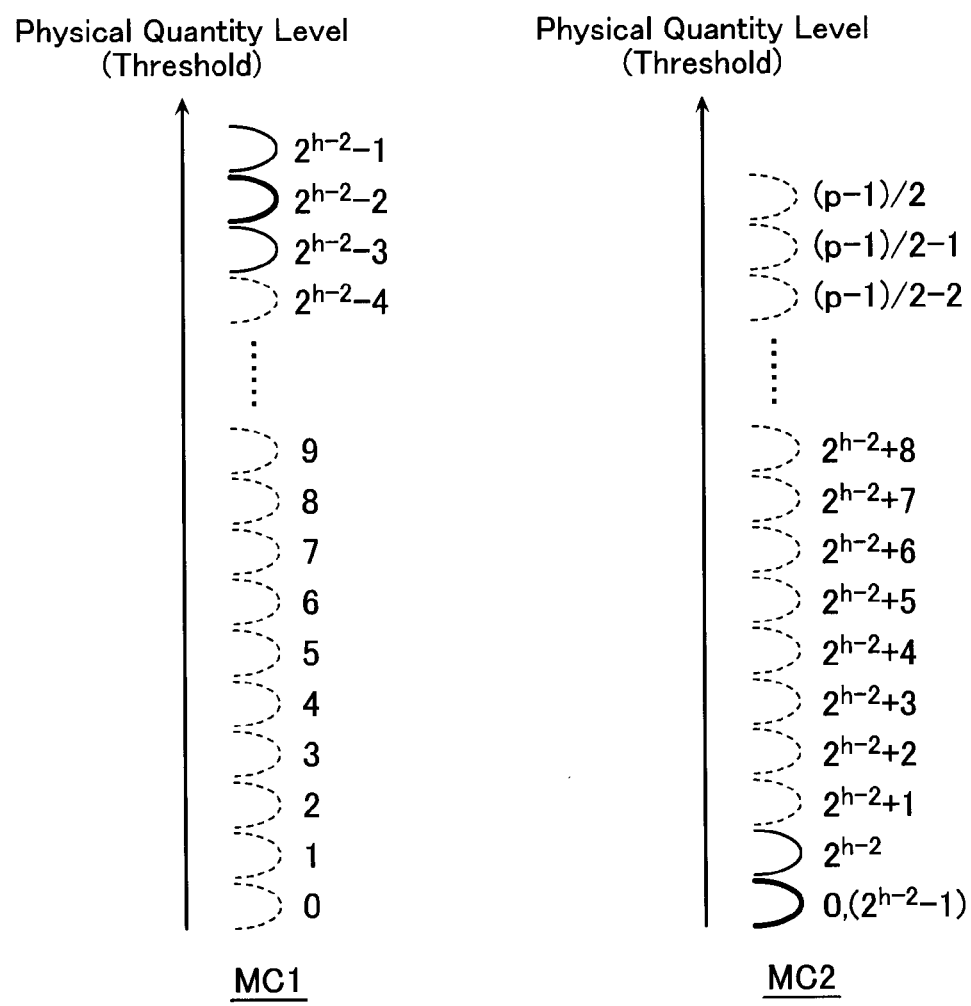
FIG. 11A is a diagram showing errors caused when one symbol is recorded in 2 multi-level memory cells in the present memory system.

FIG. 11A is a diagram showing errors caused when a symbol value of $2^{h-2}-2$ assigned to the boundary between the memory cells MC1, MC2 or the vicinity is recorded.

If an error occurs only in the memory cell MC1, the symbol value after the error occurrence turns to $2^{h-2}-1$ or $2^{h-2}-3$. In this case, the error quantity becomes ±1. If an error occurs only in the memory cell MC2, the symbol value after the error occurrence turns to $2^{h-2}$ when only the memory cell MC2 is considered. As the memory cell MC1 is at the middle level, however, the symbol value indicated by the memory cell MC2 is neglected. Therefore, the symbol value becomes $2^{h-2}-2$, which is indicated by the memory cell MC1. In this case, the error quantity becomes 0. On the other hand, if errors occur in both the memory cells MC1, MC2 and the memory cell MC1 is at the uppermost level, the symbol value after the error occurrence becomes $2^{h-2}$. In this case, the error quantity becomes +2. From the above, the errors caused when the symbol value of $2^{h-2}-2$ is recorded can fall within a range of the error quantities of −1 to +2.

Figure 11B:
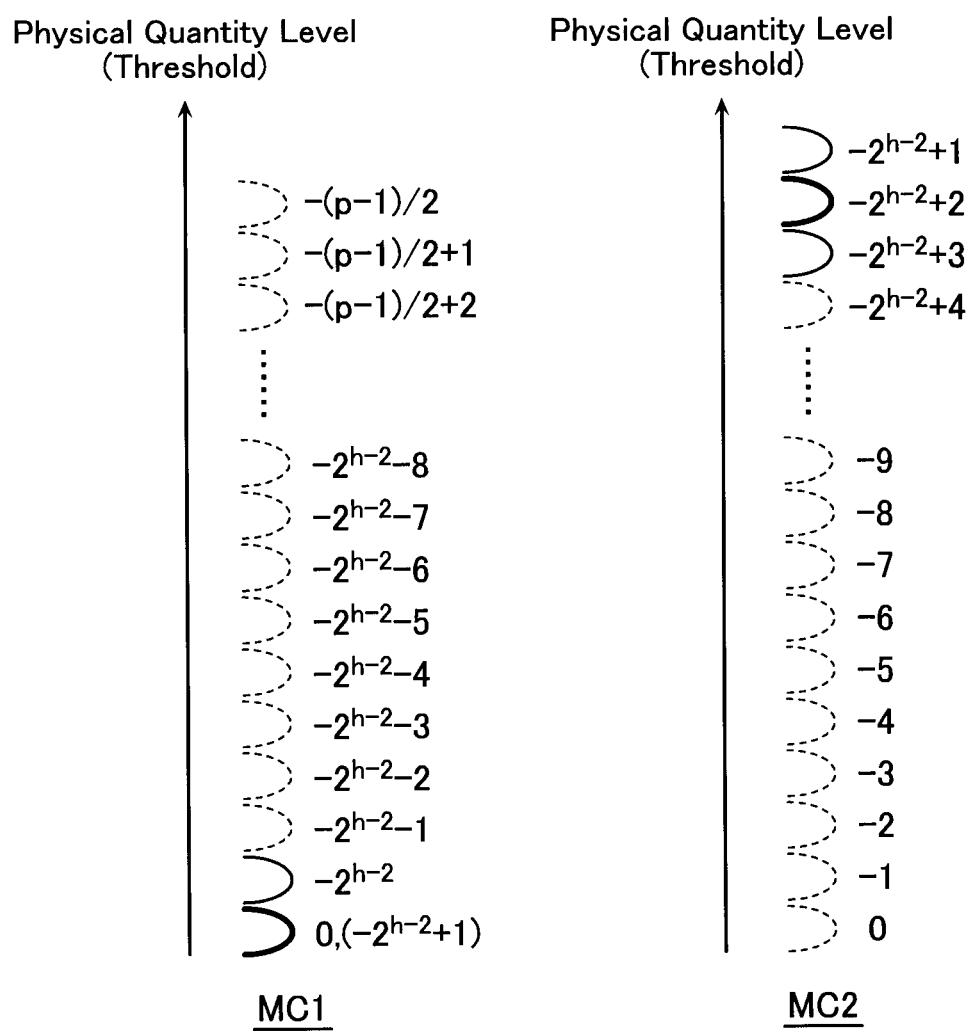
FIG. 11B is a diagram showing errors caused when one symbol is recorded in 2 multi-level memory cells in the present memory system.

FIG. 11B is a diagram showing errors caused when a symbol value of $-2^{h-2}+2$ assigned to the boundary between the memory cells MC1, MC2 or the vicinity is recorded.

If an error occurs only in the memory cell MC2, the symbol value after the error occurrence turns to $-2^{h-2}+1$ or $-2^{h-2}+3$. In this case, the error quantity becomes ±1. If an error occurs only in the memory cell MC1, the symbol value after the error occurrence turns to $-2^{h-2}$ when only the memory cell MC1 is considered. As the memory cell MC2 is at the middle level, however, the symbol value indicated by the memory cell MC1 is neglected. Therefore, the symbol value becomes $-2^{h-2}+2$, which is indicated by the memory cell MC2. In this case, the error quantity becomes 0. On the other hand, if errors occur in both the memory cells MC1, MC2 and the memory cell MC2 is at the uppermost level, the symbol value after the error occurrence becomes $-2^{h-2}$. In this case, the error quantity becomes −2. From the above, the errors caused when the symbol value of $-2^{h-2}+2$ is recorded can fall within a range of the error quantities of −2 to +1.

Here, the assignments of the minimum value and the maximum value of the symbol values (elements of Zp) to the memory cells MC1, MC2 are mentioned. The assignments of the minimum value and the maximum value of the symbol values may become uncertain in accordance with the levels that can be set in the memory cells MC1, MC2. When the symbol values of $(p-1)/2$ and $-(p-1)/2$ are assigned to the uppermost levels of the memory cells MC1, MC2, respectively, so that the memory cells MC1, MC2 are both at the uppermost levels, it is not possible to uniquely determine if the symbol value is either of $(p-1)/2$ and $-(p-1)/2$.

Figure 12A:
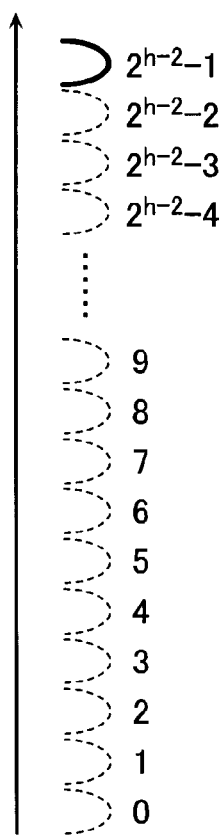
FIG. 12A is a diagram showing a rule for recording a symbol having the maximum value when one symbol is recorded in 2 multi-level memory cells in the present memory system.
Figure 12A:
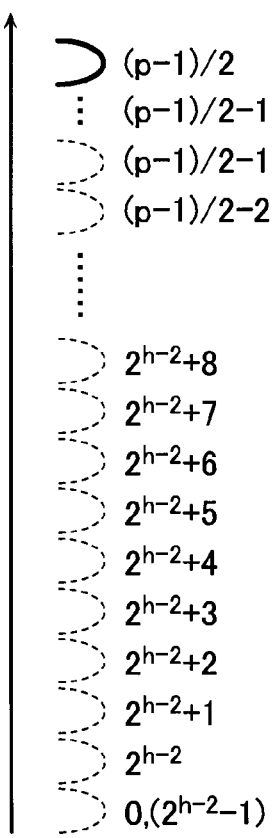
Figure 12B:
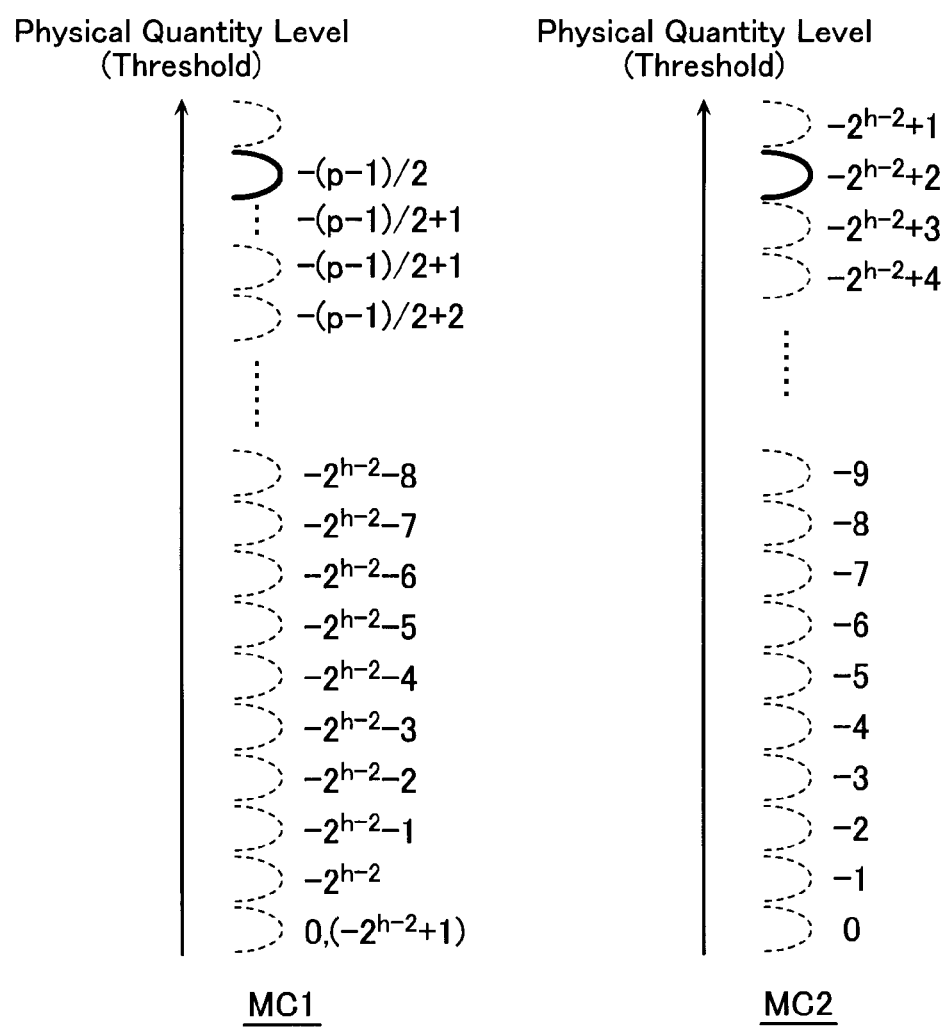
FIG. 12B is a diagram showing a rule for recording a symbol having the minimum value when one symbol is recorded in 2 multi-level memory cells in the present memory system.

Then, the symbol values of $(p-1)/2$, $-(p-1)/2$ are assigned, as shown in FIGS. 12A, 12B, independent of the number of levels of the memory cells. Namely, assignment rules of the symbol values of $(p-1)/2$, $-(p-1)/2$ are determined as follows.

(Rule 7) When the memory cells MC1, MC2 are both at the uppermost level, the maximum value of $(p-1)/2$ is assigned as the symbol value.

(Rule 8) When the memory cells MC1, MC2 are both at the second highest level, the minimum value of $-(p-1)/2$ is assigned as the symbol value.

Depending on the selection of the number of levels and the number of symbols of the memory cells MC1, MC2, the uppermost level may be assigned with no symbol value. Then, as assignment rules of the symbol values to the levels, additional rules are determined.

(Rule 9) When the level of the memory cell MC1 is at the uppermost level, and the level of the memory cell MC2 is at a level lower than the uppermost level and higher than the level assigned to the symbol value of $(p-1)/2-1$, the symbol value is given $(p-1)/2-1$.

(Rule 10) When the level of the memory cell MC2 is at the uppermost level, and the level of the memory cell MC1 is at a level lower than the uppermost level and higher than the level assigned to the symbol value of $-(p-1)/2+1$, the symbol value is given $-(p-1)/2+1$.

(Rule 11) When the memory cells MC1, MC2 are both at the third highest level, this condition is given $-(p-1)/2$.

The assignments of the minimum value and the maximum value of the symbol values to the levels of the memory cells MC1, MC2 in this way can prevent the minimum value and the maximum value of the symbol values from becoming uncertain.

Hereinafter, it is assumed that the memory cells MC1, MC2 have the number of levels larger than the number of symbols, and have 2 or more levels between the levels assigned to the symbol values of $(p-1)/2-1$ and the uppermost level, and $-(p-1)/2+1$ and the uppermost level.

Figure 13A:
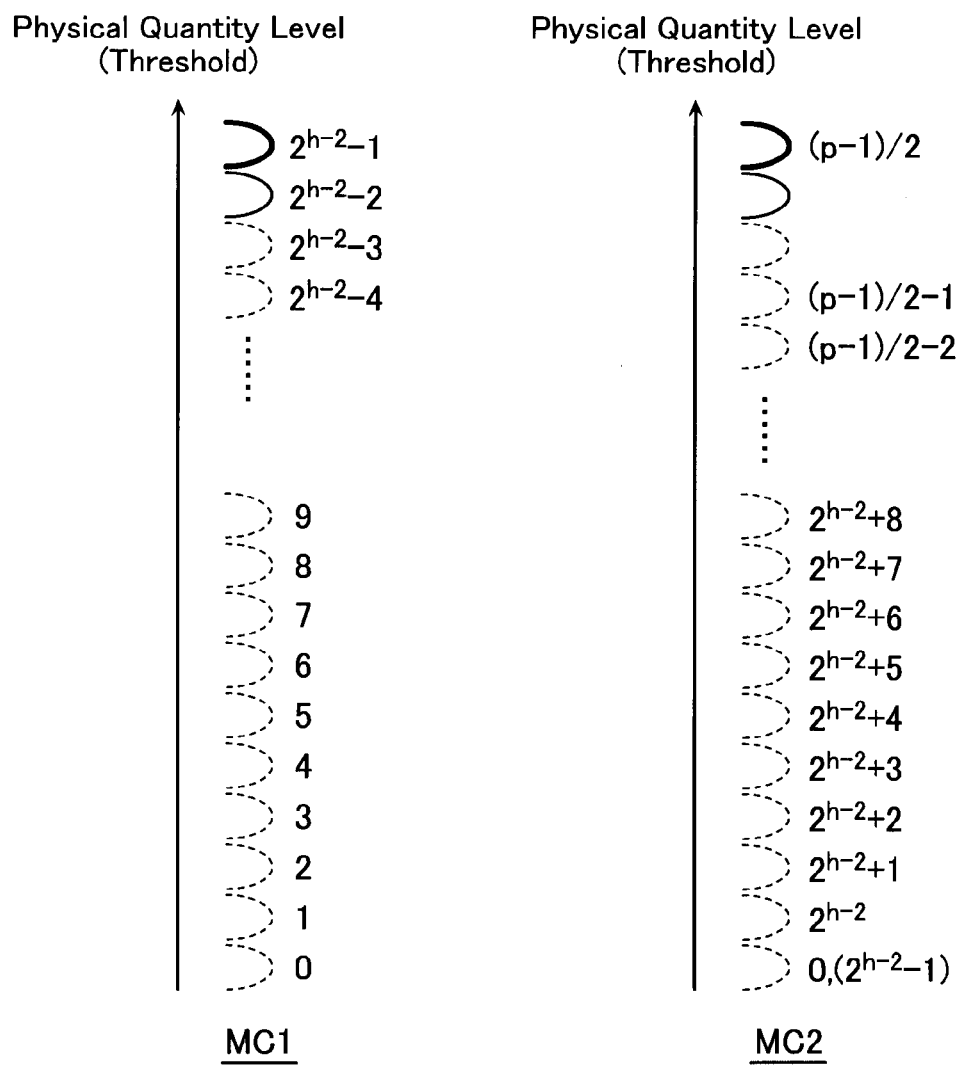
FIG. 13A is a diagram showing errors caused when one symbol is recorded in 2 multi-level cells in the present memory system.

FIG. 13A is a diagram showing errors caused when the symbol value of $(p-1)/2$ is recorded. When the symbol value is $(p-1)/2$, the memory cells MC1, MC2 are both at the uppermost level under the rule 7.

If only the memory cell MC1 suffers an error, the level of the memory cell MC1 reaches the second highest level. Therefore, the symbol value becomes $-(p-1)/2+1$ under the rule 10. The error quantity in this case becomes $\{-(p-1)/2+1\}-(p-1)/2=-p+2\equiv 2$. If only the memory cell MC2 suffers an error, the level of the memory cell MC2 reaches the second highest level. Therefore, the symbol value becomes $(p-1)/2-1$ under the rule 9. The error quantity in this case becomes $-1$. If both the memory cells MC1, MC2 suffer errors, the symbol value becomes $-(p-1)/2$ under the rule 8. The error quantity in this case becomes $-(p-1)/2-(p-1)/2=-p+1\equiv 1$. From the above, the errors caused when the symbol value of $(p-1)/2$ is recorded can fall within a range of the error quantities of $-1$ to $+2$.

Figure 13B:
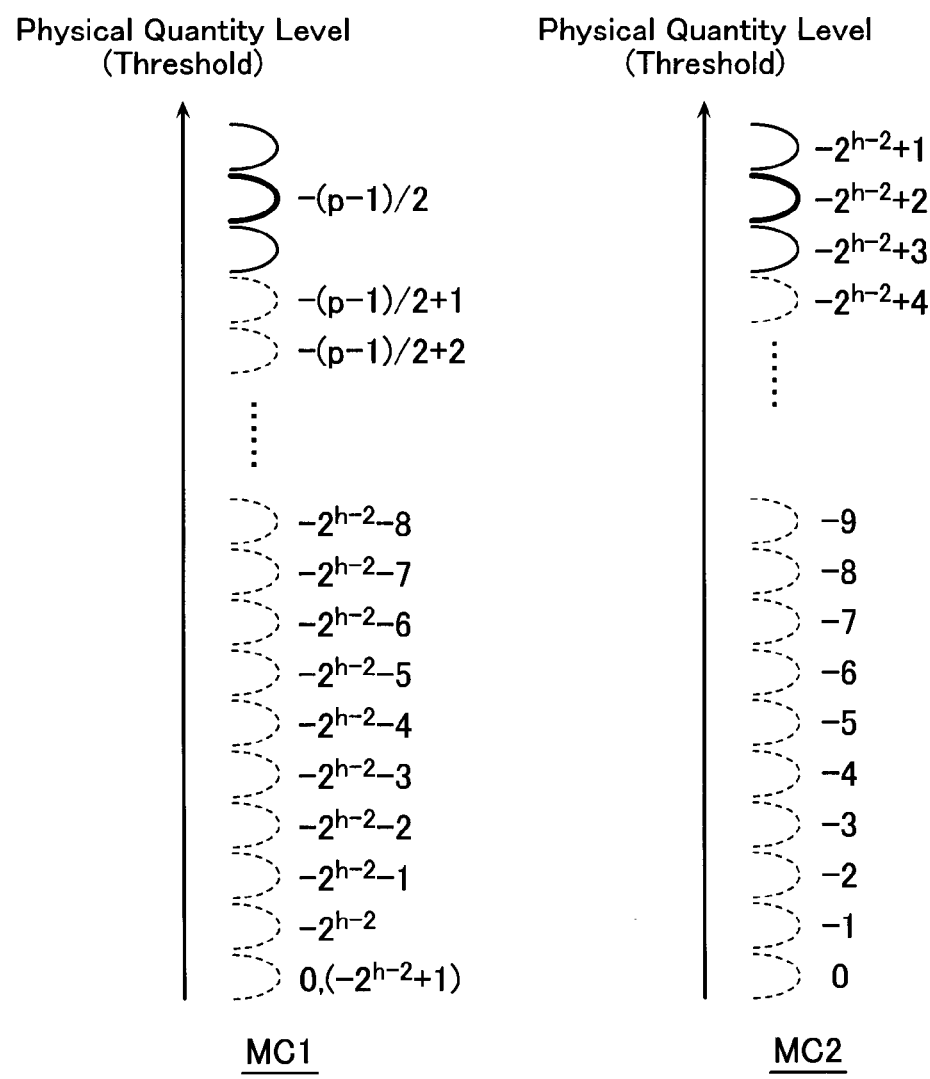
FIG. 13B is a diagram showing errors caused when one symbol is recorded in 2 multi-level memory cells in the present memory system.

FIG. 13B is a diagram showing errors caused when the symbol value of $-(p-1)/2$ is recorded. When the symbol value is $-(p-1)/2$, the memory cells MC1, MC2 are both at the second highest levels under the rule 8.

A study is made on the case where the memory cell MC1 suffers an error and reaches the uppermost level. If the memory cell MC2 suffers an error and reaches the uppermost level, the symbol value becomes $(p-1)/2$ under the rule 7. The error quantity in this case becomes $-1$. If the memory cell MC2 suffers no error, the symbol value becomes $(p-1)/2-1$ under the rule 9. The error quantity in this case becomes $-2$. If the memory cell MC2 suffers an error and reaches the third highest level, the symbol value becomes $(p-1)/2-1$ under the rule 9. The error quantity in this case becomes $-2$.

A study is made on the case where the memory cell MC1 suffers no error. If the memory cell MC2 suffers an error and reaches the uppermost level, the symbol value becomes $-(p-1)/2+1$ under the rule 10. The error quantity in this case becomes $+1$. If the memory cell MC2 suffers an error and reaches the third highest level, the symbol value becomes $(p-1)/2-1$. The error quantity in this case becomes $-2$.

A study is made on the case where the memory cell MC1 suffers an error and reaches the third highest level. If the memory cell MC2 suffers an error and reaches the uppermost level, the symbol value becomes $-(p-1)/2+1$. The error quantity in this case becomes $+1$. If the memory cell MC2 suffers no error, the symbol value becomes $-(p-1)/2+1$. The error quantity in this case becomes $+1$. If the memory cell MC2 suffers an error and reaches the third highest level, the symbol value becomes $-(p-1)/2$ under the rule 11. No error occurs in this case.

From the above, the errors caused when the symbol value of $-(p-1)/2$ is recorded can fall within a range of the error quantities of $-2$ to $+1$.

Figure 14A:
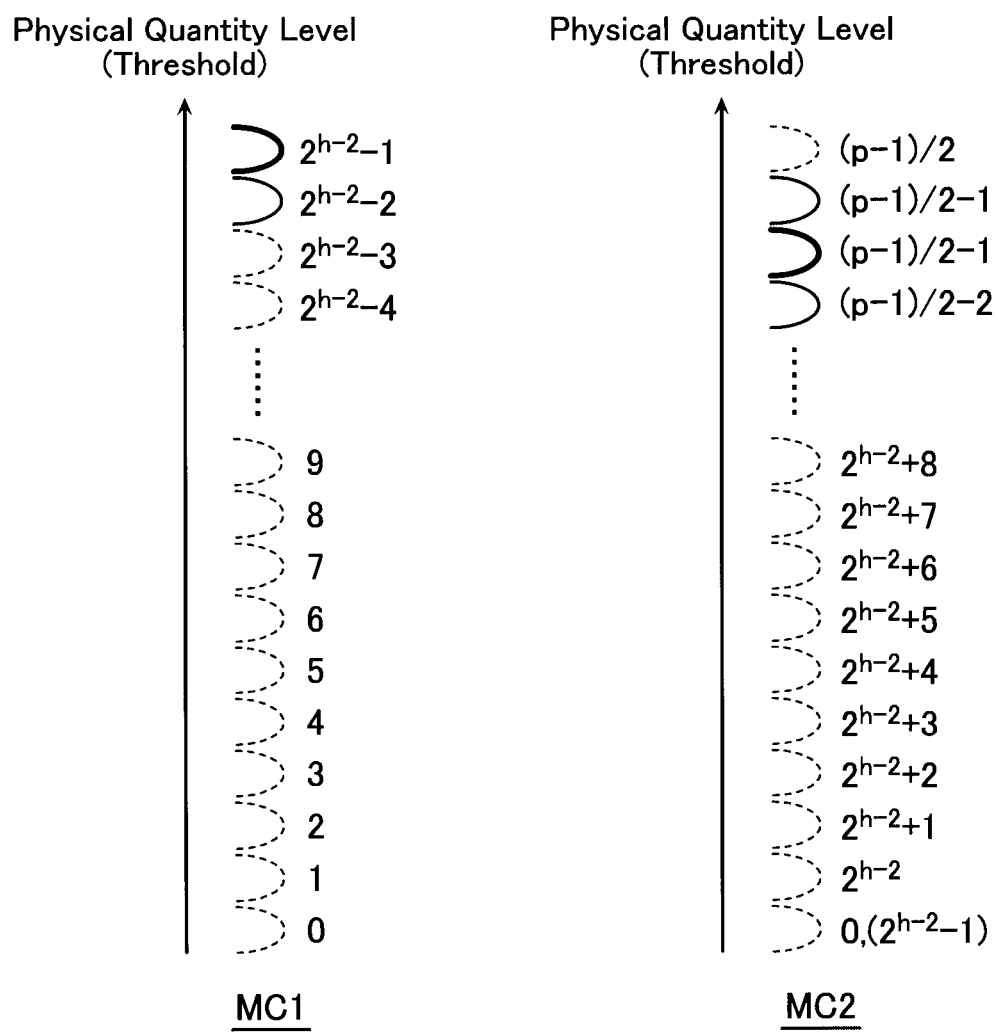
FIG. 14A is a diagram showing errors caused when one symbol is recorded in 2 multi-level memory cells in the present memory system.
Figure 14B:
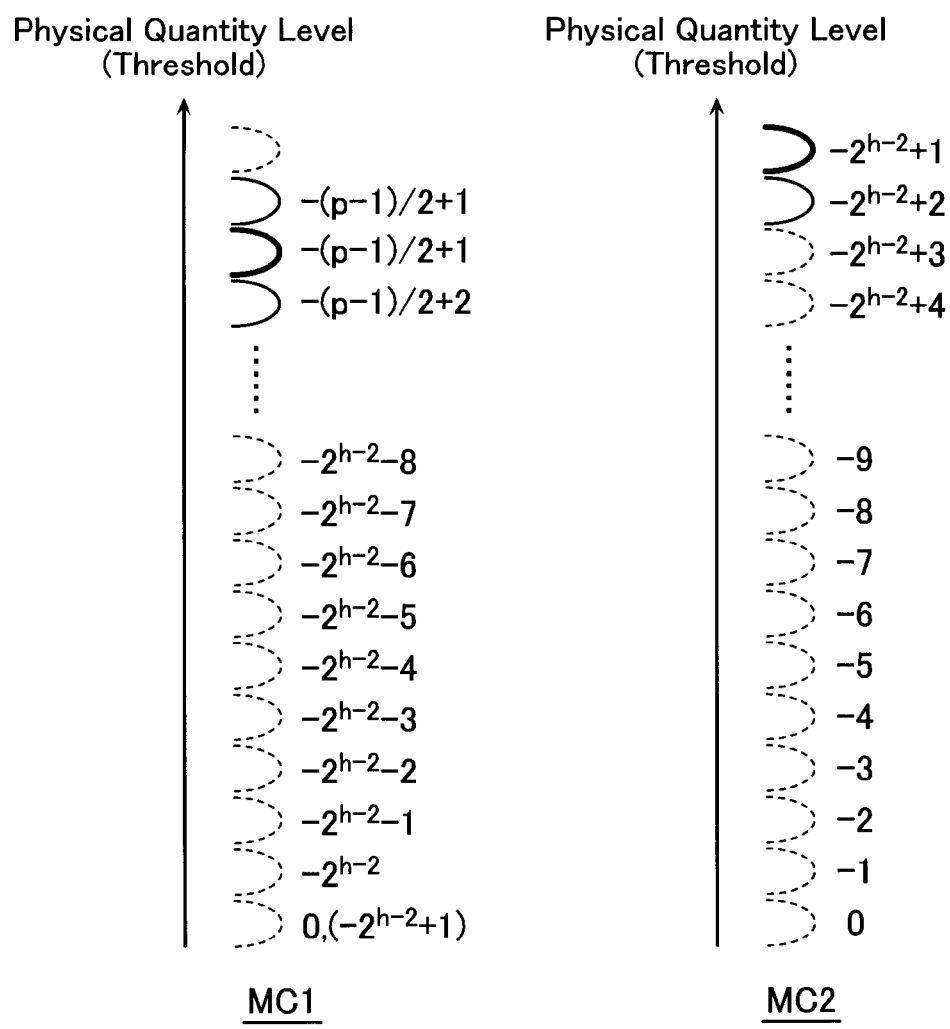
FIG. 14B is a diagram showing errors caused when one symbol is recorded in 2 multi-level memory cells in the present memory system.

FIGS. 14A, 14B show the case where the numbers of levels of the memory cells MC1, MC2 are larger than the number of elements in $Z_p$, and there is one level between the levels assigned to the symbol values of $(p-1)/2-1$, $-(p-1)/2+1$ and the uppermost level of the memory cells MC1, MC2.

In such the assignments, the states of errors caused when the symbol values are $(p-1)/2$, $-(p-1)/2$ are quite same as those shown in FIGS. 13A, 13B. This is because when at the uppermost levels, the symbol values become same as those shown in FIGS. 13A, 13B under the rule 11. Therefore, a study is herein made on errors that occur when the symbol values are $(p-1)/2-1$, $-(p-1)/2+1$.

FIG. 14A is a diagram showing errors caused when the symbol value of $(p-1)/2-1$ is recorded. When the symbol value is $(p-1)/2-1$, the memory cell MC1 is at the uppermost level correctly, and the memory cell MC2 is at the third highest level.

When only the memory cell MC1 suffers an error, no error occurs because the memory cell MC2 is at the middle level. On the other hand, when only the memory cell MC2 suffers an error and reaches the second highest level, the fourth highest level, the symbol values become $(p-1)/2-1$, $(p-1)/2-2$, respectively. The error quantities in this case are $0$, $-1$, respectively.

When the memory cells MC1, MC2 both suffer errors, the symbol values become $-(p-1)/2$, $(p-1)/2-2$. The error quantities in this case are $2$, $-1$, respectively.

From the above, the errors caused when the symbol value of $(p-1)/2-1$ is recorded can fall within a range of the error quantities of $-1$ to $+2$.

FIG. 14B is a diagram showing errors caused when the symbol value of $-(p-1)/2+1$ is recorded. When the symbol value is $-(p-1)/2+1$, the memory cell MC1 is at the third highest level correctly, and the memory cell MC2 is at the uppermost level.

When only the memory cell MC1 suffers an error and reaches the second highest level, the fourth highest level, the symbol values become $-(p-1)/2+1$, $-(p-1)/2+2$, respectively. The error quantities in this case are $0$, $+1$, respectively.

When only the memory cell MC2 suffers an error, no error occurs because the memory cell MC1 is at the middle level.

When the memory cells MC1, MC2 both suffer errors, the symbol values become −(p−1)/2, (p−1)/2+2. The error quantities in this case are −1, +1, respectively.

From the above, the errors caused when the symbol value of −(p−1)/2+1 is recorded can fall within a range of the error quantities of ±1.

Figure 15A:
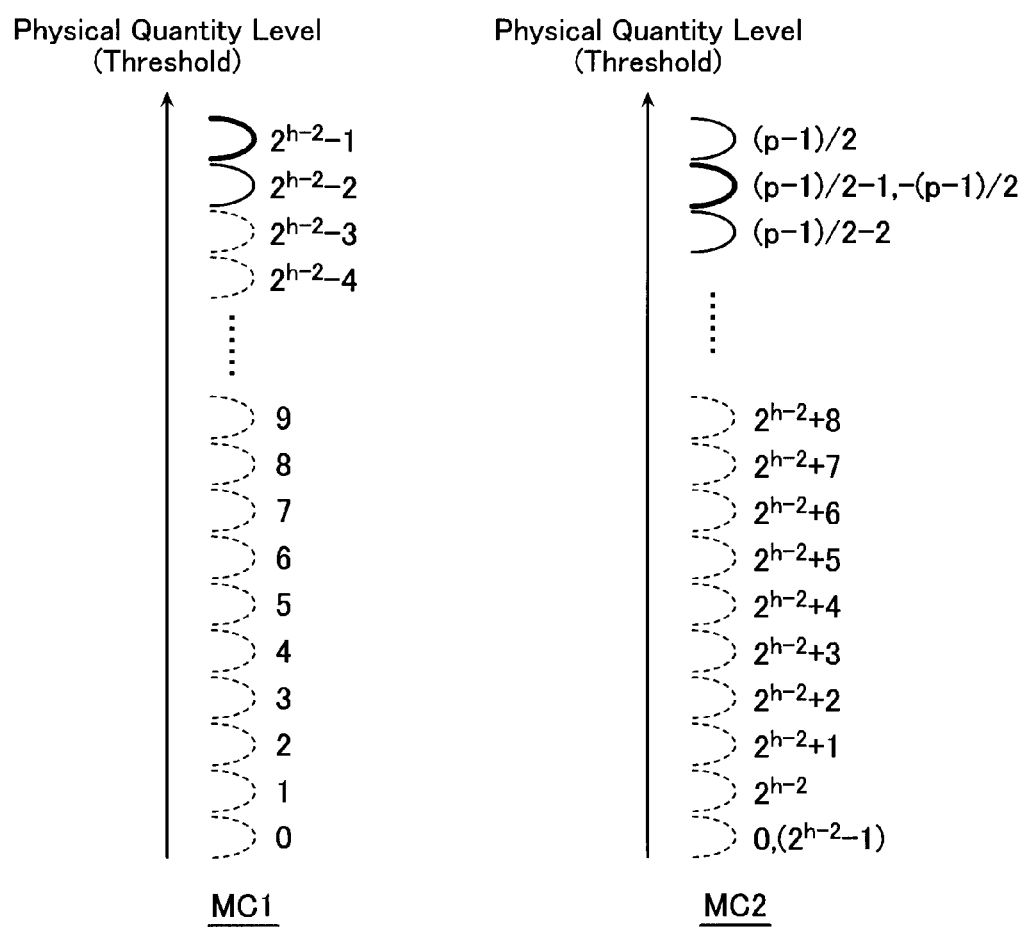
FIG. 15A is a diagram showing errors caused when one symbol is recorded in 2 multi-level memory cells in the present memory system.
Figure 15B:
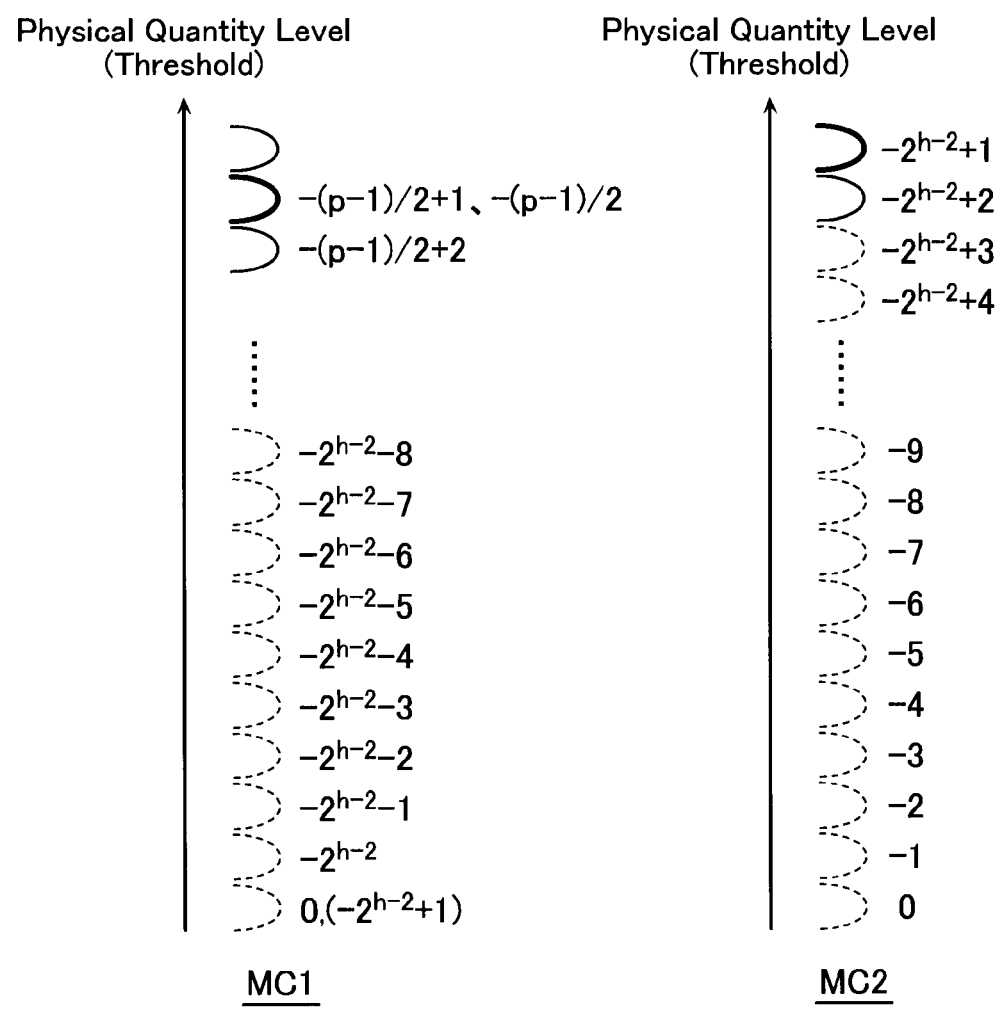
FIG. 15B is a diagram showing errors caused when one symbol is recorded in 2 multi-level memory cells in the present memory system.

FIGS. 15A, 15B show the case where the numbers of levels of the memory cells MC1, MC2 meet the number of elements in Zp, and there is no useless level between the levels assigned to the symbol values of (p−1)/2−1, −(p−1)/2+1 and the uppermost level of the memory cells MC1, MC2.

In such the assignments, the states of errors caused when the symbol values of (p−1)/2, −(p−1)/2 are recorded quite same as those shown in FIGS. 13A, 13B. This is because when at the third highest levels, the symbol values become same as those shown in FIGS. 13A, 13B under the rule 11. Therefore, a study is herein made on errors that occur when the symbol values of (p−1)/2−1, −(p−1)/2+1 are recorded.

FIG. 15A is a diagram showing errors caused when the symbol value of (p−1)/2−1 is recorded. When the symbol value is (p−1)/2−1, the memory cell MC1 is at the uppermost level correctly, and the memory cell MC2 is at the second highest level.

When only the memory cell MC1 suffers an error, the symbol value becomes −(p−1)/2. The error quantity in this case is +2.

When only the memory cell MC2 suffers an error, the symbol values become (p−1)/2, (p−1)/2−2. The error quantities in this case are +1, −1, respectively.

When the memory cells MC1, MC2 both suffer errors, the symbol values become −(p−1)/2+1, (p−1)/2−2. The error quantities in this case are 3, −1, respectively.

From the above, the errors caused when the symbol value of (p−1)/2−1 is recorded can fall within a range of the error quantities of −1 to +3.

FIG. 15B is a diagram showing errors caused when the symbol value of −(p−1)/2+1 is recorded. When the symbol value is −(p−1)/2+1, the memory cell MC1 is at the second highest level correctly, and the memory cell MC2 is at the uppermost level.

When only the memory cell MC1 suffers an error, the symbol values become +(p−1)/2, −(p−1)/2+2. The error quantities in this case are −2, +1, respectively.

When only the memory cell MC2 suffers an error, the symbol value becomes −(p−1)/2. The error quantity in this case is −1.

When the memory cells MC1, MC2 both suffer errors, the symbol values become +(p−1)/2−1, −(p−1)/2+2. The error quantities in this case are −3, +1, respectively.

From the above, the errors caused when the symbol value of −(p−1)/2+1 is recorded can fall within a range of the error quantities of −3 to +1.

From the viewpoint of the above, in the example using multi-level memory cells, the error quantities are ±3 at the maximum. Therefore, the possibility of supporting the error of a Lee metric of 3 makes it possible to support level-recognition-failed errors containing failed-level-write. Further, the use of the syndrome converting method makes it possible to completely seek a solution for errors in up to 2 code word symbols. In other word, the syndrome converting method can support even if all or part of 4 memory cells configuring 2 code word symbols have failures.

Then, for the purpose of using the multi-level memory cells to store the code word symbols in this way, pieces of data input as a bit string to the memory system are assigned to levels of memory cells. Such the method is described briefly. In the method described below, the same conversion is performed as that when the code word symbols are stored as binary data in the memory system.

The pieces of data input as a binary bit string to the memory system are regarded as groups of h bits, and each group is considered a number on each digit of a $2^h$-adic number. When the number of digits is δ, a data word D(h) is provided as shown in Expression 37 where each of $d_{\delta-1}, d_{\delta-2}, \ldots, d_1, d_0$ is unit data composed of h bits.

$$D(h) = d_{\delta-1}(2^h)^{\delta-1} + d_{\delta-2}(2^h)^{\delta-2} + \ldots + d_1(2^h)^1 + d_0(2^h)^0,$$

$$0 < d_{\delta-1} < 2^h, \ 0 \leq d_j < 2^h \qquad \text{[Expression 37]}$$

Subsequently, the data word D(h) shown in Expression 37 is converted to a p-adic word data D(h) as shown in Expression 38 where $a_\delta, a_{\delta-1}, \ldots, a_1, a_0$ are p-adic expressed data codes X represented by the groups of h bits.

$$D(h) = a_\delta(p)^\delta + a_{\delta-1}(p)^{\delta-1} + \ldots + a_1(p)^1 + a_0(p)^0,$$

$$0 \leq a_j < p, \ a_\delta + a_{\delta-1} \neq 0 \qquad \text{[Expression 38]}$$

As described earlier, an appropriate selection of the prime p can suppress the number of digits to δ+1 at this time. When multi-level memory cells are used, the number of levels cannot be increased unnecessarily. Accordingly, the number of levels and the suitable prime p are determined previously. Additionally, a data ward D(h) suitable for the condition is determined. Namely, the number of levels of memory cells is applied to determine the number M of bits of batch-processed data. This way of determining is described later in a specific example.

Subsequently, (p−1) code word symbols are created from the data codes X and the generator matrix G to turn the input data to the code C as C=XG. Each code word symbol in the code C is stored in the memory system comprising memory cells having $2^{h-2}$ multi-levels by representing a representative of expression with an integer of −p/2 to p/2.

Next, a specific example is described. Among the number M of bits of the data batch-processed in the p-LM-ECC system, the number h of bits of unit data, and the maximum value ε of the sums of Lee metrics of correctable errors, a relation of p≧M/h+ε+3 can be established as described above. In addition, the prime p is selected within a range of $2^{h-1} < p < 2^h$ as described above.

Then, as the number of levels of a memory cell, 8 levels can be taken per memory cell. In this case, h=5, and the candidate of the prime p is any one of 17, 19, 23, 29, 31. The method using 2 memory cells can handle 32 code word symbols. Accordingly, 31 is selected as the prime p that satisfy the condition of not exceeding 32.

If ε=2, then M≦130. As for handling data on a byte basis, when ECC processing is applied in batch to data of 128 bits corresponding to 16 bytes, M=128 makes δ=26. Therefore, the number κ of dummy symbols, of which value is given 0 inside the memory system, is derived 0 from κ=p−δ−ε−3=31−26−2−3. The number of symbols required excessively from the viewpoint of the data, that is, the number (n−δ) of redundant symbols is derived 4 from (n−δ)=p−1−δ=31−1−26. As a result, a redundancy ratio of the memory system is derived as a ratio of the number of digits of data and the number of digits increased excessively, that is, 4/26=2/13. This can be regarded as an increase ratio of memory cells required excessively to enable error correction.

For information, 2 multi-level memory cells herein described can be used to store symbols of which number is a little less than 4 times the number of levels per memory cell. This method is also effective in the case where ECC is not used. Bit data may be expressed in a p-adic number and a number on each digit may be corresponded as an element in $Z_p$ to a level. Accordingly, double the number $\delta$ of digits is almost equal to the number of multi-level memory cells capable of storing M bits. On the other hand, when the conventional method of using multi-level memory cells is used, a memory cell of $2^{h-2}$ levels can achieve storage of (h−2) bits. Accordingly, storage of M bits requires memory cells of which number is just $M/(h-2)=h\delta/(h-2)=\delta(1-2/h)-1$.

Therefore, in the p-LM-ECC system in the present embodiment, M bits are stored in the form of a code composed of n symbols using 2 memory cells per symbol, and accordingly $2n=2(p-1)$ memory cells are required. Then, the substantial redundancy, that is, how many times the capacity of data storage are required, is given by $2(p-1)/5(1-2/h)-1$. Specifically, in the case of h=5, p=31 makes $\delta$=26 and accordingly the substantial redundancy is 60/43=1.40. As $\epsilon$=2, it is possible to correct errors in 2 pairs of memory cells at the maximum.

As the next specific example, described is the case where the number of levels per memory cell is 8 and $\epsilon$ is 4. In the case of this specific example, it is possible to correct errors in 4 pairs of memory cells at the maximum.

First, the redundancy ratio of the memory system according to the present embodiment in this case is shown. If h=5, then 31 may be selected as a prime p, for example. As $\epsilon$=4 makes $M\leq120$, so M=120 (15 bytes) is set, for example, as the number M of bits of batch-processed data. In this case, $\delta$=24, and the number $\kappa$ of dummy symbols is derived 0 from $\kappa=p-\delta-\epsilon-3=31-24-4-3$. Therefore, the number (n−$\delta$) of redundant symbols is derived 6 from $(n-\delta)=p-1-\delta=31-1-4$. From the above, the redundancy ratio of the present memory system is 6/24=3/12.

Subsequently, a redundancy ratio to the conventional memory system using no ECC system is shown. In the case of the conventional memory system, the number of memory cells having the number of levels equal to 8 (3 bits) for use in 120-bit data storage is 40. In contrast, in the case of the present embodiment, the number of memory cells is 60. From the above, the redundancy ratio to the conventional memory system is 60/40=1.5.

As the next specific example, described is the case where the number of levels per memory cell is 16 and $\epsilon$ is 4. In the case of this specific example, it is possible to correct errors in 4 pairs of memory cells at the maximum.

First, the redundancy ratio of the memory system according to the present embodiment in this case is shown. If h=6, then 61 may be selected as a prime p, for example. As $\epsilon$=4 makes $M\leq324$, so M=324 (40.5 bytes) is set, for example, as the number M of bits of batch-processed data. In this case, $\delta$=54, and the number $\kappa$ of dummy symbols is derived 0 from $\kappa=p-\delta-\epsilon-3=61-54-4-3$. Therefore, the number (n−$\delta$) of redundant symbols is derived 6 from $(n-\delta)=p-1\delta=61-1-54$. From the above, the redundancy ratio of the present memory system is 6/54=1/19.

Subsequently, a redundancy ratio to the conventional memory system using no ECC system is shown. In the case of the conventional memory system, the number of memory cells having the number of levels equal to 16 (4 bits) for use in 120-bit data storage is 81. In contrast, in the case of the present embodiment, the number of memory cells is 120. From the above, the redundancy ratio to the conventional memory system is $120/81\approx1.48$.

The redundancies in the case of storing 1 symbol in 2 multi-level memory cells have been studied through the above 3 specific examples. FIG. 16 shows a table arranging relations among the number of levels of 1 memory cell, the selected prime p, the maximum value $\epsilon$ of the sums of correctable Lee metrics, the minimum remedy rate, the maximum value Mmax of the numbers of bits of batch-processed data, the number M of bits of batch-processed data, the number $\delta$ of pieces of unit data, the number of memory cells required in the conventional memory system, and the redundancy to the conventional memory system. In FIG. 16, the minimum remedy rate is given 2/(p−1) because 2 code word symbols can be corrected from n=p−1 at the minimum independent of the error quantity.

As shown with underlines in FIG. 16, under the condition that the redundancy to the conventional memory system is turned to 1.5 or below, for example, $\epsilon$=4 or below can be selected at the number of levels equal to 8 or higher. Though, smaller $\epsilon$ increases failed corrections that correct other codes as they are correct. Accordingly, it is desirable to increase $\epsilon$ as large as possible to the limit of the redundancy. In addition, an application to the number of levels equal to 2, that is, a single-bit memory cell is not practical as can be found from FIG. 16.

[Second Embodiment]

Next, as a second embodiment, an application to a memory system using single-level memory cells is described.

In this case, as the number of levels of memory cells causes no restriction, it is possible to increase batch-processed data and extremely lower the redundancy.

The procedure of encoding is similar to that in the case where multi-level memory cells are used, and the number M of bits of batch-processed data is determined first and then a prime p is selected.

As a specific example, a selection example on a prime p in the case of M=4096 (512 bytes) is described. Here, $\epsilon$ is 4. In this case, $\gamma=\epsilon+1=5$.

First, it is assumed that the number of bits in unit data is h=8. In this case, according to the above-described selection condition on the prime p, a selection range of primes p is derived 128<p<256 from $2^{h-1}<p<2^h$. In this case, however, it is required to satisfy $p\geq4096/8+4+3=519$ as $p\geq M/h+\epsilon+3+\kappa$ and accordingly it is not possible to select a prime p.

Then, the number of bits in unit data is turned to h=9. In this case, a selection range of primes p is turned to 256<p<512 and $p\geq4096/9+4+3=462.1$. Therefore, it is possible to select a prime p from a range of 463<p<512. Then, the minimum 467 is selected as the prime p from the primes 467, 479, 487, 491, 499, 503, 509 within the range so as to minimize the number $\kappa$ of dummy symbols.

When the prime is p=467, the number of pieces of batch-processed unit data is $\delta$=456, and the number of redundant bits is $h(\gamma+1+\kappa)=9(4+2+4)=90$. As a result, the redundancy of the conventional memory system using no ECC system is (4096+90)/4096=1.02, which is smaller than that in the case where multi-level memory cells are used. On the other hand, however, the minimum remedy rate is 2/466=1/233, which is around 1-digit smaller than that of multi-level memory cells.

Hereinafter, the redundancies under several condition settings in the memory cell system using single-level memory cells are evaluated.

The tables shown in FIGS. 17-22 show relations among the maximum value $\epsilon$ of the sums of Lee metrics of correctable errors, the number M of bits of batch-processed data, the number $\delta$ of pieces of unit data, $\delta+\epsilon+3$ (a selection condition of the prime p), $2^{h-1}<p<2^h$ (a selection condition of the prime p), the number $\kappa$ of dummy symbols, and the number h (p−1−$\delta$) of redundant bits indicative of the redundancy. The numbers M of bits of batch-processed data are shown as 256, 512, 1024, 2048, 4096.

As a comparison example, the number of elements in $GF(2^n)$ and the number of redundant bits of the RS-ECC system using the GF($2^n$) are shown together. The number of elements (symbols) and the number of redundant bits herein shown are computed while a group of h bits of unit data determined on the prime p is regarded as 1 symbol.

FIG. 17 provides a table in the case where errors in 2 code word symbols are made correctable ($\epsilon$=2). The RS-ECC system shown in FIG. 17 is possible to correct errors in up to 2 symbols.

The selection range of primes p is limited by the number M of bits of batch-processed data. Therefore, p=53 when M=256 (32 bytes), p=79 when M=512 (64 bytes), p=137 when M=1024 (128 bytes), and p=461 when M=4096 (512 bytes). When M=2048 (256 bytes), it is not possible to select a prime p.

Errors caused in 2 code word symbols can be corrected even in the RS-ECC system of the comparison example. Therefore, if the number of redundant bits cannot be made smaller, it is useless applying the p-LM-ECC system in the present embodiment.

As shown in FIG. 17, the number of redundant bits in the p-LM-ECC system when $\epsilon$=2 is not made smaller than that in the RS-ECC system. Therefore, there is no advantageous point in comparison with the RS-ECC system when $\epsilon$=2.

FIG. 18 provides a table in the case where errors in 3 code word symbols are made correctable ($\epsilon$=3). The RS-ECC system shown in FIG. 18 is possible to correct errors in up to 3 symbols.

The case where $\epsilon$=3 is different from the case where $\epsilon$=2 shown in FIG. 17 in that the prime is p=83 when M=512 (64 bytes), and the prime is p=463 when M=4096 (512 bytes).

Also in this case, the number of redundant bits is not made smaller than that in the RS-ECC system and accordingly there is no advantageous point in comparison with the RS-ECC system.

FIG. 19 provides a table in the case where errors in 4 code word symbols are made correctable ($\epsilon$=4). The RS-ECC system shown in FIG. 19 is possible to correct errors in up to 4 symbols.

The case where $\epsilon$=4 is different from the case where $\epsilon$=3 shown in FIG. 18 in that the prime is p=467 when M=4096 (512 bytes).

Also in this case, the number of redundant bits is not made smaller than that in the RS-ECC system and accordingly there is no advantageous point in comparison with the RS-ECC system.

FIG. 20 provides a table in the case where errors in 6 code word symbols can be corrected ($\epsilon$=6). The RS-ECC system shown in FIG. 20 is possible to correct errors in up to 6 symbols.

The case where $\epsilon$=6 is indifferent from the case where $\epsilon$=4 shown in FIG. 19 in the primes p to be selected.

When the p-LM-ECC system is used, it is advantageous because the number of redundant bits can be made smaller than that in the RS-ECC system configured to correct errors in 6 symbols. It is required, though, to consider that the p-LM-ECC system cannot correct all error patterns. If the number of error-caused symbols is 2 or less, a solution for errors can be sought completely. Further, even if the number of error-caused symbols is 3 or more, errors can be corrected if the sum of correctable Lee metrics is 6 or less. Therefore, up to the sum of error-caused symbols equal to 6, errors can be corrected to the extent. From the above point, in the case where $\epsilon$=6, the application of the p-LM-ECC system is effective.

FIG. 21 provides a table in the case where errors in 7 code word symbols are made correctable ($\epsilon$=7). The RS-ECC system shown in FIG. 21 is possible to correct errors in up to 7 symbols.

The case where $\epsilon$=7 is different from the case where $\epsilon$=6 shown in FIG. 20 in that the prime is p=59 when M=256 (32 bytes), the prime is p=89 when M=512 (64 bytes), and the prime is p=139 when M=1024 (128 bytes).

When the p-LM-ECC system is used, it is advantageous because the number of redundant bits can be made smaller than that in the RS-ECC system configured to correct errors in 7 symbols. Also in this case, it cannot support all error patterns though it is effective in that a solution for errors in up to 2 symbols can be sought completely, and that errors in 7 symbols at the maximum can be corrected.

FIG. 22 provides a table in the case where errors in 8 code word symbols are made correctable ($\epsilon$=8). The RS-ECC system shown in FIG. 22 is possible to correct errors in up to 6 symbols.

The case where $\epsilon$=8 is indifferent from the case where $\epsilon$=7 shown in FIG. 21 in the primes p to be selected.

When the p-LM-ECC system is used, it is possible to make the number of redundant bits smaller than that in the RS-ECC system configured to correct errors in 8 symbols. Also in this case, it cannot support all error patterns though it is effective in that a solution for errors in up to 2 symbols can be sought completely, and that errors in 8 symbols at the maximum can be corrected.

As described above, the p-LM-ECC system can exert the advantage over the RS-ECC system in the following case as shown in FIGS. 17-22. In a word, if the number of bits of batch-processed data is M=4096 (512 bytes), the selectable prime is p=467 unchanged at $\epsilon$=4–8, and the number of redundant bits is 90. Therefore, $\epsilon$=8 is desirable. Similarly, it is possible to exert the advantage over the RS-ECC system at $\epsilon$=6 when M=1024 (128 bytes), at $\epsilon$=6 when M=512 (64 bytes), and at $\epsilon$=6 when M=256 (32 bytes).

[Conclusion]

Here, the encoding procedure, the decoding procedure, and the system configuration of the p-LM-ECC system in the present embodiment are arranged again.

The encoding procedure is arranged using FIG. 2. In FIG. 2, the prime p that determines Zp, the number $\epsilon$ (=$\gamma$–1) of correctable symbols in the case where the error quantity in 1 symbol is 1, the number h of binary-expressed digits of symbols, and the number M(=$\delta$h) of bits of batch-processed data are determined previously. In addition, there are relations of n=p–1, k=n–$\gamma$.

The procedure of encoding is roughly divided into 2 stages as follows.

(Procedure 1) First, pieces of binary data fed from external to the memory system are grouped at every h bits, and converted to a $2^h$-adic expressed $\delta$-digit data word D(h) shown in Expression 38 (S1 in FIG. 2).

$$D(h)=(d_0, d_1, \ldots, d_{\delta-1})$$ [Expression 39]

Subsequently, the data word D(h) shown in Expression 39 is converted further to a p-adic expressed ($\delta$+1)-digit data word D(h) shown in Expression 40 (S2 in FIG. 2).

$$D(h)=(a_0, a_1, \ldots, a_\delta)$$ [Expression 40]

(Procedure 2) First, to the elements $a_0$-$a_\delta$ of Zp obtained through Procedure 1, only $\kappa$ zeros are added to obtain k elements $a_0$-$a_{k-1}$ of data D shown in Expression 41.

$$D(h)=(a_0, a_1, \ldots, a_{k-1})$$ [Expression 41]

Subsequently, this data D is multiplied by a generator matrix G to obtain n code word symbols $c_1$-$c_n$ of a code C (S3 in FIG. 2). The value of each code word symbol is as shown in Expression 42.

$$c_j = \sum_{i=0}^{k-1} (j)^{i+1} a_i \qquad \text{[Expression 42]}$$

Finally, the code word symbols $c_j$ are stored in memory cells (S4 in FIG. 2).

The decoding procedure is arranged using FIGS. 3A, 3B.

The procedure of decoding is roughly divided to 7 procedures as follows. Hereinafter, the procedure numbers are serial numbers containing the procedure of encoding. Take note that Procedures 3 and 4 shown below are repeated over the elements (m=0 to p−2) of Zp.

(Procedure 3) A code Y read out of memory cells is read out (S5 in FIG. 3A). The code Y is configured as shown in Expression 43. Here, $e_j$ denotes an error in the code word symbol at the position j of the code Y.

$$Y=(y_1,y_2,\ldots,y_n)$$

$$Y=C+E, E=(e_1, e_2, \ldots, e_n) \qquad \text{[Expression 43]}$$

Subsequently, the values $y_j$ (j=1 to n) of n code word symbols contained in the code Y are multiplied by $j^m$ to compute $j^m y_j$ as numbers of Zp. The symbol value $y_j$ can be sought from the level in the case of the multi-level memory cell. In the case of a general binary memory, it is a number obtained from binary data. The code Y is multiplied by a transpose of a syndrome matrix H to obtain a syndrome series S (=YH$^T$) composed of syndromes $S_m$ to $S_{m+\epsilon}$ as shown in Expression 44 (S6 in FIG. 3A).

$$S = (S_m, S_{m+1}, \ldots, S_{m+\epsilon}), \qquad \text{[Expression 44]}$$

$$S_l = \sum_{j=1}^{p-1} (j)^l y_j = \sum_{j=1}^{p-1} (j)^l e_j$$

(Procedure 4) First, with regard to the upper limit $\epsilon$ (=γ−1) of the number of correctable symbols, $q=\epsilon S_m^{-1}$ is computed to obtain $qS_m$ to $qS_{m+\epsilon}$ from the syndrome $S_1$ obtained through Procedure 3. Subsequently, coefficients $\psi_j$ of a solution searching polynomial $\Psi(x)$ shown in Expression 45 are computed sequentially from $qS_m$ to $qS_{m+\epsilon}$ (S7 in FIG. 3A).

$$\Psi(x) = 1 + \sum_{l=1}^{\gamma-1} \psi_l x^l, \qquad \text{[Expression 45]}$$

$$\psi_j = -j^{-1} \sum_{i=1}^{j} \psi_{j-i} q S_{m+i}$$

Here, if the coefficient of $x^\epsilon$ is $\psi_\epsilon \neq 0$, then the process goes to Procedure 5 to obtain a solution. On the other hand, if $\psi_\epsilon=0$, the process is terminated as no solution. Otherwise, in order to further search the possibility of correction, $\eta=\epsilon-1$ is used to compute $q=\eta S_m^{-1}$, then Procedure 4 is repeated. If the coefficient of $x^\eta$ is $\psi_\eta \neq 0$, then the process goes to Procedure 5 to obtain a solution. On the other hand, if $\psi_\eta=0$, the process is terminated as no solution. If the process cannot be performed in Procedure 4, the error correction is interrupted as no solution because the error distribution is not supportable.

(Procedure 5) If it is found that no solution can be obtained as a result of $\psi_\epsilon \neq 0$ in Procedure 4, a solution is obtained in Procedures 5, 6. First, in Procedure 5, in order to obtain the multiplicity of the solution, a Hasse differential polynomial $[\Psi(x)]^{[i]}$ shown in Expression 46 is sought. The coefficients $\psi_j$ obtained through Procedure 4 are multiplied by a series of binomial coefficients to obtain coefficients of the Hasse differential polynomial (S9 in FIG. 3A).

$$[\Psi(x)]^{[i]} = \sum_{j=1}^{} \binom{j}{i} \psi_j x^{j-i}, \qquad \text{[Expression 46]}$$

$$\Psi^{[i]} = \left\{ \binom{i}{i} \psi_i, \binom{i+1}{i} \psi_{i+1}, \binom{i+2}{i} \psi_{i+2}, \ldots \right\}$$

(Procedure 6) The elements 1 to p−1 of Zp are substituted into the resultant Hasse differential polynomial to seek all the elements r that can make the O-order differential polynomial (=$\Psi(x)$) be equal to zero. Subsequently, as shown in Expression 47, such the degree n is sought that makes the (n−1)-order differential polynomial be equal to zero over each r but the n-order differential polynomial be not equal to zero (S10 in FIG. 3B).

$$[\Psi(r)]^{[0]} = \Psi(r) = 0, \qquad \text{[Expression 47]}$$

$$[\Psi(r)]^{[n-1]} = \sum_{j=n-1} \binom{j}{n-1} \psi_j r^{j-n+1} = 0,$$

$$[\Psi(r)]^{[n]} = \sum_{j=n} \binom{j}{n} \psi_j r^{j-n} \neq 0$$

The obtained r is an inverse element of the position of the code word symbol in the error-caused code, and the corresponding n is the quantity converted from the caused error quantity.

(Procedure 7) In Procedure 7, the error quantity is sought through a conversion from the multiplicity n of the solution. The position of the error-caused code word symbol is $t=r^{-1}$, and the reverse conversion of the conversion performed to obtain the polynomial for obtaining a solution is applied to n. As there is a relation of $qt^m e_t=n$, the original error quantity $e_t$ can be derived from n as $e_t=(qt^m)^{-1}n$. The error quantity $e_t$ is subtracted from the symbol value $y_t$ of the code Y read out of memory cells to obtain the symbol value $c_t$ of the corrected code C (S11 in FIG. 3B).

Up to now, as the correct code C stored in the memory system is obtained, the binary data input to the memory system is sought through Procedures 8 and 9.

(Procedure 8) From the code C error-corrected through Procedure 7 and the generator matrix G, k elements $a_0$ to $a_{k-1}$ of GF(p) are sought via a multi-variable system of linear equations XG=C. Among those, κ elements are dummy elements (0). Accordingly, substantially (δ+1) elements $a_0$ to $a_δ$ of GF(p) can be obtained. From the obtained elements $a_0$ to $a_δ$, (δ+1)-digit p-adic expressed data word D(h) is created (S12 in FIG. 3B).

(Procedure 9) Finally, the data word D(h) is converted to a δ-digit binary-expression to bring a numeral on each digit to a binary expression. Thus, the restoration of binary data fed to the memory system is completed (S13 in FIG. 3B).

Next, the configuration of the memory system is arranged using FIG. 1.

The memory system comprises the memory unit 100 and the p-LM-ECC system 200 as roughly divided.

The binary-expressed data D fed from external is supplied to the p-adic number converter unit 201. The p-adic number converter unit converts the data D to a δ-digit p-adic expressed data word D(h).

The data word D(h) output from the p-adic number converter unit 201 is supplied to the encoder unit 202. The encoder unit 202 exerts the generator matrix G on the data word D(h) to create the code C composed of the elements of GF(p). The code C output from the encoder unit 202 is fed to and stored in the memory unit 100 including flash memories, PRAMs, ReRAMs and so forth.

The code Y (error-containing code C) read out of the memory unit 100 is fed to the syndrome generator unit 203. The syndrome generator unit 203 makes m=0 and additionally performs the process of multiplying the code Y by the syndrome H and an m-th power of the number indicative of the position of the code word symbol of the code Y read out of the memory unit 100 to create the syndrome S using a diagonal matrix. If the syndrome S is equal to zero, the code contains no error. Accordingly, the code Y is processed as the code C as it is in the decoder unit 207. On the other hand, if the syndrome S is not equal to zero, the process goes to the solution searching polynomial generator unit 204 for error correction.

The solution searching polynomial generator unit 204 generates a solution searching polynomial Ψ(x) from the syndrome S output from the syndrome generator unit 203. If the coefficient on the degree at the η (=γ−1)-order thereof is not equal to zero, the process goes to the Hasse differential polynomial generator unit 205 for searching a solution. On the other hand, if the coefficient on the degree at the n-order is equal to zero, the process goes to the solution searching polynomial generator unit 204 again to search a solution searching polynomial Ψ(x) for a new n obtained by subtracting 1 from η, as required. Even though, if the coefficient at the η-order is still equal to zero, the process goes to the syndrome generator unit 203 to search a new syndrome S after further adding 1 to m. The series of processes is repeated until the coefficient at the η-order of the solution searching polynomial Ψ(x) reaches zero. If the coefficient at the η-order of the solution searching polynomial Ψ(x) is still equal to zero even after the process is repeated up to η=γ−2, m=p−2, error correction is impossible. Therefore, an error signal NG is provided to external. Even if error correction is possible, an inconsistent code may be obtained after a series of processes is repeated over all m to seek a corrected code. This case can be decided as failed correction and regarded as the so-called list error correction that contains the correct code in the obtained codes.

The Hasse differential polynomial generator unit 205 derives a Hasse differential polynomial from the solution searching polynomial Ψ(x) of which coefficient at the n-order is non-zero and extracts the root r thereof and the multiplicity of the root from GF(p).

The code restorer unit 206 uses the root r extracted at the Hasse differential polynomial generator unit 205 to seek the position of an error symbol in the code Y from $t=r^{-1}$ and uses the multiplicity n to seek the error quantity $e_t$. This result is applied to restore the code C.

The code C restored at the code restorer unit 206 is supplied to the decoder unit 207. The decoder unit 207 reverse-converts the generator matrix G over the code C to regenerate the p-adic expressed data word D(h).

The p-adic expressed data word D(h) regenerated at the decoder unit is supplied to the binary converter unit 208. The binary converter unit 208 converts the p-adic expressed data word D(h) to a $2^h$-adic expressed data word D(h) to generate binary data D. Finally, the binary data D is provided to external as read data.

FIG. 1 shows the case where the p-LM-ECC system is contained inside the memory system though the p-LM-ECC system may be located outside the memory system.

Finally, the error correction ability of the syndrome converting method applied in the memory system according to the embodiment is described again. Here, a study is made on the error correction ability of the p-LM-ECC system capable of correcting 4 symbols at the maximum in comparison with the RS-ECC system capable of correcting 2 symbols and the $2^n$-BCH-ECC system capable of correcting 4 random bit errors.

FIG. 23 provides a table arranging OK/NG of error correction by these 3 ECC systems. A square in the "error" row of the table images a symbol, and a black dot located inside the square images an error-caused bit. For information, 1 symbol includes 8 bits.

When the RS-ECC system is used, any errors can be corrected up to 2 symbols. As shown in FIG. 23, however, even if the number of error bits is smaller, they cannot be corrected entirely if they distribute over 3 or more symbols.

When the $2^n$-BCH-ECC system is used, any errors caused can be corrected up to 4 bits. If there are 5-bit errors or more, the errors cannot be corrected even if they can be contained in 1 symbol.

When the p-LM-ECC system according to the embodiment is used, any errors can be corrected if they can be contained in 2 symbols. Further, even errors spreading over 3 or more symbols, 4 symbols can be corrected at the maximum if the error contents are analogous among symbols. In the case of the p-LM-ECC system, errors distributing over 4 symbols cannot be corrected completely though it is effective because the redundancy is lower than the RS-ECC system.

As obvious from the above, the RS-ECC system is strong in correction of burst errors while it is weak in correction of random errors. In addition, the $2^n$-BCH-ECC system is strong in correction of random errors while it is weak in correction of burst errors. Therefore, in the RS-ECC system and the $2^n$-BCH-ECC system, it is difficult to support the case where random errors and burst errors occur frequently due to fine fabrication of the memory system. With this regard, the p-LM-ECC system according to the embodiment can support such random errors and burst errors and accordingly it is optimal to fine-fabricated memory systems.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The embodiments described above are applicable to memory systems using memory cells having 3 or more levels. For example, they are applicable to memory systems using flash memories, DRAMs, PRAMs, ReRAMs and so forth.

What is claimed is:

1. A memory system, comprising:
   a p-adic number converter unit operative to divide batch-processed binary data D into δ-digit (δ is an integer), h-bit (h is an integer) symbols and convert the symbols to a k-digit (k is an integer), p-adic data word (p is a prime of 3 or more);
   an encoder unit operative to generate, from said data word p-adic converted at said p-adic number converter unit, a code C composed of a residual field Zp of the prime p, of n-digit (n=p−1) code words having numbers on digits each indicated by h bits;
   a memory unit operative to store the code C of Zp generated at said encoder unit as write data;
   an error correcting unit operative to generate, from read data Y read out from said memory unit, a syndrome S and apply an operation using said generated syndrome S for error correcting said read data Y to regenerate the code C of Zp;
   a decoder unit operative to reverse-convert the code C of Zp regenerated at said error correcting unit to regenerate the p-adic data word; and
   a binary converter unit operative to convert the data word regenerated at said decoder unit to a binary number to regenerate the binary data D.

2. The memory system according to claim 1, wherein said memory unit has a plurality of memory cells capable of setting at least $2^{h-2}$-stage physical quantity levels,
   wherein said memory unit,
   (1) when both 2 memory cells are set to a physical quantity level near the minimum, makes data correspond to 0,
   (2) when both 2 memory cells are set to a physical quantity level near the maximum, makes data correspond to −(p−1)/2 or (p−1)/2,
   (3) when one memory cell of 2 memory cells is set to the minimum physical quantity level, makes the physical quantity level of the other memory cell correspond to data of −1 to $-2^{h-2}+1$,
   (4) when the other memory cell of 2 memory cells is set to the minimum physical quantity level, makes the physical quantity level of the one memory cell correspond to data of 1 to $2^{h-2}-1$,
   (5) when the one memory cell of 2 memory cells is set to the maximum physical quantity level, makes the physical quantity level of the other memory cell correspond to data of $2^{h-2}$ to (p−1)/2−1, and
   (6) when the other memory cell of 2 memory cells is set to the maximum physical quantity level, makes the physical quantity level of the one memory cell correspond to data of $-2^{h-2}$ to −(p−1)/2+1.

3. The memory system according to claim 1, wherein said error correcting unit uses ϵ=γ−1 to denote the maximum value of the sums of Lee metrics of correctable errors, seeks u for a previously determined element $\eta=uS_0$ on components $S_0, S_1, \ldots, S_{\gamma-1}$ of said syndrome S to generate a new syndrome S in accordance with $$S = uS_0, uS_1, \ldots, uS_{\gamma-1}$$

and generates a polynomial Ψ(x) in accordance with $$\Psi(x) = 1 + \sum_{i=1}^{\varepsilon} \Psi_i x^i,$$

$$\Psi_j = -j^{-1} \sum_{i=1}^{j} \Psi_{j-i} u S_i$$

for use in said operation.

4. The memory system according to claim 1, wherein if $2^{h-}\leq n \leq 2(2^{h-1}-1)$, and ϵ denotes the maximum value of the sums of Lee metrics of correctable errors, there is a relation of δ+ϵ+2+κ=n (κ=an integer of 0 to 10).

5. The memory system according to claim 1, wherein there is a relation of $2^{h-1} < p < 2^h$.

6. The memory system according to claim 1, wherein said error correcting unit includes
   a syndrome generator unit operative to generate said syndrome S from said read data Y,
   a solution searching polynomial generator unit operative to derive coefficients of a solution searching polynomial Ψ(x) from said syndrome S to generate said solution searching polynomial Ψ(x),
   a Hasse differential polynomial generator unit operative to generate a Hasse differential polynomial [Ψ(x)] from said solution searching polynomial Ψ(x) to extract the root r of said Hasse differential polynomial [Ψ(x)] and the multiplicity of the root r, and
   a code restorer unit operative to derive the position of the error in the data Y and the error quantity from the root r and the multiplicity of the root r to regenerate said code C.

7. The memory system according to claim 2, wherein said memory unit,
   (7) when both 2 memory cells are set to the maximum physical quantity level, makes data correspond to data of (p−1)/2, and
   (8) when both 2 memory cells are set to a physical quantity level near the maximum below the maximum physical quantity level, makes data correspond to data of −(p−1)/2.

8. The memory system according to claim 7, wherein said memory unit,
   (9) when the one memory cell of 2 memory cells is set to the maximum physical quantity level, makes the physical quantity level near the maximum below the maximum physical quantity level of the other memory cell correspond to data of (p−1)/2−1, and
   (10) when the other memory cell of 2 memory cells is set to the maximum physical quantity level, makes the physical quantity level near the maximum below the maximum physical quantity level of the one memory cell correspond to data −(p−1)/2+1.

9. A method of data writing and reading in memory systems, comprising:
   dividing batch-processed binary data D into δ-digit (δ is an integer), h-bit (h is an integer) symbols and converting the symbols to a k-digit (k is an integer), p-adic data word (p is a prime of 3 or more);
   generating, from said p-adic converted data word, a code C composed of a residual field Zp of the prime p, of n-digit (n=p−1) code words having numbers on digits each indicated by h bits;
   storing the generated code C of Zp in a memory unit as write data;
   generating, from read data Y read out from said memory unit, a syndrome S and applying an operation using said generated syndrome S for error correcting said read data Y to regenerate the code C of Zp;
   reverse-converting the regenerated code C of Zp to regenerate the p-adic data word; and
   converting the regenerated data word to a binary number to regenerate the binary data D.

10. The method of data writing and reading in memory systems according to claim 9, wherein the step of applying said operation using said syndrome S for error correcting said read data Y includes using $\epsilon=\gamma-1$ to denote the maximum value of the sums of Lee metrics of correctable errors, seeking u for a previously determined element $\eta=uS_0$ on components $S_0$, $S_1, \ldots, S_{\gamma-1}$ of said syndrome S to generate a new syndrome S in accordance with $$S=uS_0, uS_1, \ldots, uS_{\gamma-1}$$

and generating a polynomial $\Psi(x)$ in accordance with $$\Psi(x) = 1 + \sum_{l=1}^{\epsilon} \Psi_l x^l,$$

$$\Psi_j = -j^{-1} \sum_{i=1}^{j} \Psi_{j-i} uS_i$$

for use in said operation.

11. The method of data writing and reading in memory systems according to claim 9, wherein if $2^{h-1} \leq n \leq 2(2^{h-1}-1)$, and $\epsilon$ denotes the maximum value of the sums of Lee metrics of correctable errors, there is a relation of $\delta+\epsilon+2+\kappa=n$ ($\kappa=$an integer of 0 to 10).

12. A memory system, comprising:
a p-adic number converter unit operative to divide batch-processed binary data D into $\delta$-digit ($\delta$ is an integer), h-bit (h is an integer) symbols and convert the symbols to a k-digit (k is an integer), p-adic data word (p is an integer of 3 or more);
an encoder unit operative to generate, from said data word p-adic converted at said p-adic number converter unit, a code C composed of n-digit (n=p-1) code words having numbers on digits each indicated by h bits;
a memory unit having a plurality of memory cells, capable of setting p-stage physical quantity levels with at least one or plural memory cells, and operative to store the code C generated at said encoder unit, said numbers on digits of said h-bit code words, as write data in accordance with said physical quantity levels;
an error correcting unit operative to error-correct, from read data Y read out from said memory unit, said numbers on digits of said h-bit code words;
a decoder unit operative to reverse-convert the code C error-corrected at said error correcting unit to regenerate the p-adic data word; and
a binary converter unit operative to convert the data word regenerated at said decoder unit to a binary number to regenerate the binary data D.

13. The memory system according to claim 12, wherein said memory unit has a plurality of memory cells capable of setting at least $2^{h-2}$-stage physical quantity levels,
wherein said memory unit,
(1) when both 2 memory cells are set to a physical quantity level near the minimum, makes data correspond to 0,
(2) when both 2 memory cells are set to a physical quantity level near the maximum, makes data correspond to $-(p-1)/2$ or $(p-1)/2$,
(3) when one memory cell of 2 memory cells is set to the minimum physical quantity level, makes the physical quantity level of the other memory cell correspond to data of $-1$ to $-2^{h-2}+1$,
(4) when the other memory cell of 2 memory cells is set to the minimum physical quantity level, makes the physical quantity level of the one memory cell correspond to data of 1 to $2^{h-2}-1$,
(5) when the one memory cell of 2 memory cells is set to the maximum physical quantity level, makes the physical quantity level of the other memory cell correspond to data of $2^{h-2}$ to $(p-1)/2-1$, and
(6) when the other memory cell of 2 memory cells is set to the maximum physical quantity level, makes the physical quantity level of the one memory cell correspond to data of $-2^{h-2}$ to $-(p-1)/2+1$.

14. The memory system according to claim 12, wherein said error correcting unit uses $\epsilon=\gamma-1$ to denote the maximum value of the sums of Lee metrics of correctable errors, seeks u for a previously determined element $\eta=uS_0$ on components $S_0, S_1, \ldots, S_{\gamma-1}$ of said syndrome S to generate a new syndrome S in accordance with $$S=uS_0, uS_1, \ldots, uS_{\gamma-1}$$

and generates a polynomial $\Psi(x)$ in accordance with $$\Psi(x) = 1 + \sum_{l=1}^{\epsilon} \Psi_l x^l,$$

$$\Psi_j = -j^{-1} \sum_{i=1}^{j} \Psi_{j-i} uS_i$$

for use in said operation.

15. The memory system according to claim 12, wherein if $2^{h-1} \leq n \leq 2(2^{h-1}-1)$, and $\epsilon$ denotes the maximum value of the sums of Lee metrics of correctable errors, there is a relation of $\delta+\epsilon+2+\kappa=n$ ($\kappa=$an integer of 0 to 10).

16. The memory system according to claim 12, wherein said error correcting unit includes
a syndrome generator unit operative to generate said syndrome S from said read data Y,
a solution searching polynomial generator unit operative to derive coefficients of a solution searching polynomial $\Psi(x)$ from said syndrome S to generate said solution searching polynomial $\Psi(x)$,
a Hasse differential polynomial generator unit operative to generate a Hasse differential polynomial $[\Psi(x)]$ from said solution searching polynomial $\Psi(x)$ to extract the root r of said Hasse differential polynomial $[\Psi(x)]$ and the multiplicity of the root r, and
a code restorer unit operative to derive the position of the error in the data Y and the error quantity from the root r and the multiplicity of the root r to regenerate said code C.

17. The memory system according to claim 13, wherein said memory unit,
(7) when both 2 memory cells are set to the maximum physical quantity level, makes data correspond to data of $(p-1)/2$, and
(8) when both 2 memory cells are set to a physical quantity level near the maximum below the maximum physical quantity level, makes data correspond to data of $-(p-1)/2$.

18. The memory system according to claim 17, wherein said memory unit,
(9) when the one memory cell of 2 memory cells is set to the maximum physical quantity level, makes the physical quantity level near the maximum below the maximum physical quantity level of the other memory cell correspond to data of $(p-1)/2-1$, and

(10) when the other memory cell of 2 memory cells is set to the maximum physical quantity level, makes the physical quantity level near the maximum below the maximum physical quantity level of the one memory cell correspond to data $-(p-1)/2+1$.

* * * * *